(12) United States Patent
Stultz et al.

(10) Patent No.: US 11,658,451 B2
(45) Date of Patent: May 23, 2023

(54) SYSTEMS AND METHODS FOR CONTROL OF WAVEFORM-AGILE LASER TRANSMITTER

(71) Applicant: Raytheon Company, Waltham, MA (US)

(72) Inventors: Robert D. Stultz, El Segundo, CA (US); Derek Hendry, El Segundo, CA (US); Eran Marcus, El Segundo, CA (US)

(73) Assignee: RAYTHEON COMPANY, Waltham, MA (US)

( * ) Notice: Subject to any disclaimer, the term of this patent is extended or adjusted under 35 U.S.C. 154(b) by 394 days.

(21) Appl. No.: 16/928,512

(22) Filed: Jul. 14, 2020

(65) Prior Publication Data

US 2022/0021174 A1 Jan. 20, 2022

(51) Int. Cl.
| | |
|---|---|
| *H01S 3/067* | (2006.01) |
| *G01S 7/484* | (2006.01) |
| *H04B 10/50* | (2013.01) |
| *G01S 17/10* | (2020.01) |

(52) U.S. Cl.
CPC .......... *H01S 3/06754* (2013.01); *G01S 7/484* (2013.01); *G01S 17/10* (2013.01); *H04B 10/504* (2013.01)

(58) Field of Classification Search
None
See application file for complete search history.

(56) References Cited

U.S. PATENT DOCUMENTS

| | | | | |
|---|---|---|---|---|
| 6,724,783 B2* | 4/2004 | Jalali | ................... | H04B 10/503 372/9 |
| 9,952,315 B2* | 4/2018 | Boland | .................. | G01S 7/484 |
| 10,114,107 B2 | 10/2018 | Boland et al. | | |
| 2009/0010288 A1* | 1/2009 | Keaton | ................. | H01S 3/2325 372/25 |
| 2016/0164240 A1* | 6/2016 | Boland | .................... | G02F 1/37 359/238 |
| 2019/0107606 A1* | 4/2019 | Russell | ................. | G01S 7/4817 |

* cited by examiner

*Primary Examiner* — Eric L Bolda
(74) *Attorney, Agent, or Firm* — Burns & Levinson, LLP; Joseph M. Maraia

(57) ABSTRACT

A laser transmitter including a waveform controller arranged to generate a waveform script having at least one of a pulse repetition frequency setting, a pulse duration setting, and a pulse amplitude pre-warp setting. The transmitter also includes an optical waveform generator arranged to: i) receive the waveform script, ii) generate pre-warped signal pulses based on the waveform script to compensate for gain distortion effects of a laser power amplifier, and iii) output the pre-warped signal pulses. The laser power amplifier is arranged to: i) receive the pre-warped signal pulses, ii) receive a continuous wave signal, and iii) output amplified signal pulses that maintain a substantially constant drive intensity at the input of a non-linear wavelength converter. The non-linear wavelength converter is arranged to receive the amplified signal pulses and emit wavelength-converted pulses.

18 Claims, 18 Drawing Sheets

SYSTEMS AND METHODS FOR CONTROL OF WAVEFORM-AGILE LASER TRANSMITTER

TECHNICAL FIELD

This application relates generally to laser radar systems and, more particularly, to laser radar transmitters.

BACKGROUND

Laser Detection and Ranging (LADAR), also referred to as LIDAR or LiDAR, is a laser-based radar technology used to capture high-resolution imaging information and to measure distances by illuminating a target object or terrain with laser light. LADAR has been used to create high resolution survey maps of geographic areas and detailed 3-D images of objects. More recently, LADAR has been implemented to support control and navigation of autonomous cars. LADAR uses ultraviolet, visible, or near infrared light to image objects or terrains. Using a narrow laser beam, a LADAR system can detect physical features of objects with extremely high resolutions.

LADAR transmitters typically operate over a broad range of rapidly-changing pulse repetition frequencies (PRFs). This results in a significant variation in laser pulse energy and corresponding peak power. LADAR transmitters often use nonlinear wavelength converters that are sensitive to peak power changes at the fundamental wavelength, and therefore are adversely affected by these PRF changes. Hence conventional LADAR transmitters incorporating a nonlinear wavelength converter are typically confined to a very limited range of PRF, or require some means of adaptive optics to actively adjust the beam size and intensity of the fundamental wavelength incident on the nonlinear device. Such approaches are inherently slow and do not allow for rapid pulse-to-pulse dithering of the PRF, which is often required in LADAR system ranging and imaging. Existing beamline optics adjustment approaches between LADAR modes adds transmitter down time when switching LADAR modes. Furthermore, the use of active adaptive optics to adjust beam area at the wavelength converter is too slow for rapid PRF-dithering, and too complex for most LADAR applications.

SUMMARY

The application, in various implementations, addresses deficiencies associated with the control, responsiveness, power efficiency, and frequency range of existing LADAR transmitters.

This application describes exemplary LADAR transmitters and methods for enabling a broad range of rapidly changing PRFs, while maintaining constant peak power when pumping a nonlinear wavelength converter, including providing a process for optimum pulse waveform control that enables continuous operation over the broad PRF range. Under-driving a nonlinear wavelength converter results in sub-optimum power conversion efficiency. Over-driving a wavelength converter results in an increase in optical damage risk, as well as degraded output beam quality. The systems, devices, and methods described herein provide techniques for maintaining a constant, and optimum, drive intensity on the nonlinear wavelength converter while rapidly changing the PRF. This is accomplished without the need for any active adjustment of the incident beam area. The systems, devices, and methods also provide for rapidly dithering pulse timing while maintaining a constant output peak power from a CW-pumped solid-state amplifier.

The inventive LADAR transmitters, systems, and methods described herein allow a single laser transmitter to be configured rapidly to satisfy a variety of functions, operating conditions, and/or modes such as, without limitation: a Low PRF, long pulsewidth, high pulse energy mode for coarse detection; a high PRF, short pulsewidth, low pulse energy mode for enhanced target resolution and motion sensitivity; and an intermediate mode and/or settings that can be leveraged in response to operating conditions or functional requirements. Various inventive implementations described herein provide a continuous spectrum of modes for LADAR transmitters with previously unattainable degrees of flexibility and control.

In one aspect, a laser transmitter includes a waveform controller arranged to generate a waveform script where the waveform script includes a pulse repetition frequency setting, a pulse duration setting, and/or a pulse amplitude pre-warp setting. The transmitter also includes an optical waveform generator arranged to: i) receive the waveform script, ii) generate pre-warped signal pulses based on the waveform script to compensate for gain distortion effects of a laser power amplifier, and iii) output the pre-warped signal pulses. The laser power amplifier is arranged to: i) receive the pre-warped signal pulses, ii) receive a continuous wave signal, and iii) output amplified signal pulses that maintain a substantially constant drive intensity at the input of a non-linear wavelength converter. The non-linear wavelength converter is arranged to receive the amplified signal pulses and emit wavelength-converted pulses.

The waveform controller may adjust the pulse duration setting as a function of the pulse repetition frequency setting. The pulse duration setting may be configured to be inversely proportional to the pulse repetition frequency setting. The waveform controller may adjust the pulse duration setting and pulse repetition frequency setting over a range of pulse repetition frequencies to maintain a substantially constant peak power of the amplified signal pulses from the laser power amplifier. The waveform controller may adjust the pulse amplitude pre-warp setting to configure the laser power amplifier to generate substantially square amplified pulse signals.

The waveform controller may adjust at least one setting of the waveform script to implement waveform dithering. The waveform controller may select a nominal pulse repetition frequency setting and generate a pseudo-random sequence of pulse repetitions frequencies that vary around the nominal pulse repetition frequency setting. The waveform controller may generate a sequence of pulse durations for the amplified signal pulses corresponding to the pseudo-random sequence of pulse repetition frequencies. The waveform controller may generate the sequence of pulse durations and the pseudo-random sequence of pulse repetition frequencies based on a pre-warp function used for all of the amplified signal pulses. The waveform controller may be arranged to adjust the pulse repetition frequency setting over a range of about 15 kHz to 65 kHz in real time.

In another aspect, a method for laser transmission includes: generating a waveform script, where the waveform script includes a pulse repetition frequency setting, a pulse duration setting, and/or a pulse amplitude pre-warp setting; generating pre-warped signal pulses based on the waveform script to compensate for gain distortion effects of a laser power amplifier; receiving, at the laser power amplifier, a continuous wave signal; generating, from the laser power amplifier, amplified signal pulses that maintain a substantially constant drive intensity at the input of a non-linear wavelength converter; and outputting, from the non-linear wavelength converter, wavelength-converted pulses.

The method may include adjusting the pulse duration setting as a function of the pulse repetition frequency setting. The pulse duration setting may be inversely proportional to the pulse repetition frequency setting. The method may include adjusting the pulse duration setting and pulse repetition frequency setting over a range of pulse repetition frequencies to maintain a substantially constant peak power of the amplified signal pulses from the laser power amplifier. The method may include adjusting the pulse amplitude pre-warp setting to configure the laser power amplifier to generate substantially square amplified pulse signals.

The method may include adjusting at least one setting of the waveform script to implement waveform dithering. The method may also include selecting a nominal pulse repetition frequency setting and generating a pseudo-random sequence of pulse repetitions frequencies that vary around the nominal pulse repetition frequency setting. The method may further include generating a sequence of pulse durations for the amplified signal pulses corresponding to the pseudo-random sequence of pulse repetition frequencies. The method may include generating the sequence of pulse durations and the pseudo-random sequence of pulse repetition frequencies based on a pre-warp function used for all of the amplified signal pulses.

In a further aspect, a laser detection and ranging system includes a laser transmitter having a waveform controller arranged to generate a waveform script. The waveform script includes a pulse repetition frequency setting, a pulse duration setting, and/or a pulse amplitude pre-warp setting. The transmitter includes an optical waveform generator arranged to: i) receive the waveform script, ii) generate pre-warped signal pulses based on the waveform script to compensate for gain distortion effects of a laser power amplifier, and iii) output the pre-warped signal pulses. The laser power amplifier is arranged to: i) receive the pre-warped signal pulses, ii) receive a continuous wave signal, and iii) output amplified signal pulses that maintain a substantially constant drive intensity at the input of a non-linear wavelength converter. The non-linear wavelength converter is arranged to receive the amplified signal pulses and emit wavelength-converted pulses. The laser detection and ranging system also includes a receiver arranged to receive reflected laser beam pulses corresponding the emitted wavelength-converted pulses. The laser detection and ranging system further includes a processor arranged to process the received scattered laser pulses and generate LADAR image data.

Any two or more of the features described in this specification, including in this summary section, may be combined to form implementations not specifically described in this specification. Furthermore, while this specification may refer to examples of systems and methods related to LADAR systems or LADAR frequency bands, the implementations and methods herein equally apply to transmitters operating in other electromagnetic frequency bands.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

The application, in various aspects, addresses deficiencies associated with conventional LADAR transmitters. The application includes exemplary devices, systems and methods for laser transmitters to operate more efficiently over a broad range of PRFs.

Figure 1:
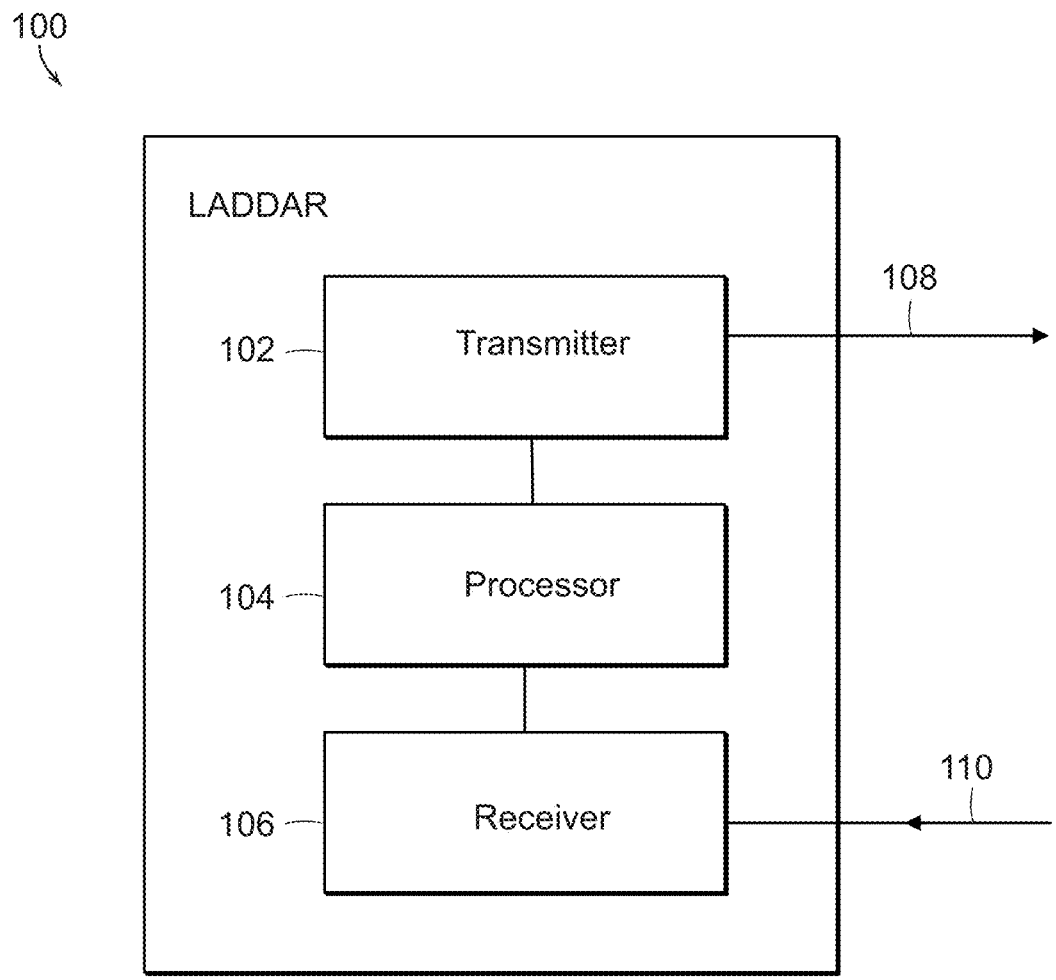
FIG. 1 is a block diagram of an exemplary laser detection and ranging (LADAR) system.

FIG. 1 is a block diagram of an exemplary LADAR system 100. System 100 includes a laser transmitter 102, a processor 104, and a receiver 106. Laser transmitter 102 is configured to emit laser pulses and/or wavelength-converted pulses 108 while receiver 106 is configured to receive reflected and/or returned laser pulses 110 scattered from a target object and/or terrain. Processor 104 may perform functions such as, without limitation, streaming cross-correlations, artifact corrections, target acquisitions, and tracking and discrimination of targets. Processor 104 may generate image data and/or information for other systems such as an automatic target recognizer (ATR) system or AEGIS combat system and/or network. Laser transmitter 102 may include a laser transmitter such as described later herein with respect to FIGS. 3 and 4.

Figure 2:
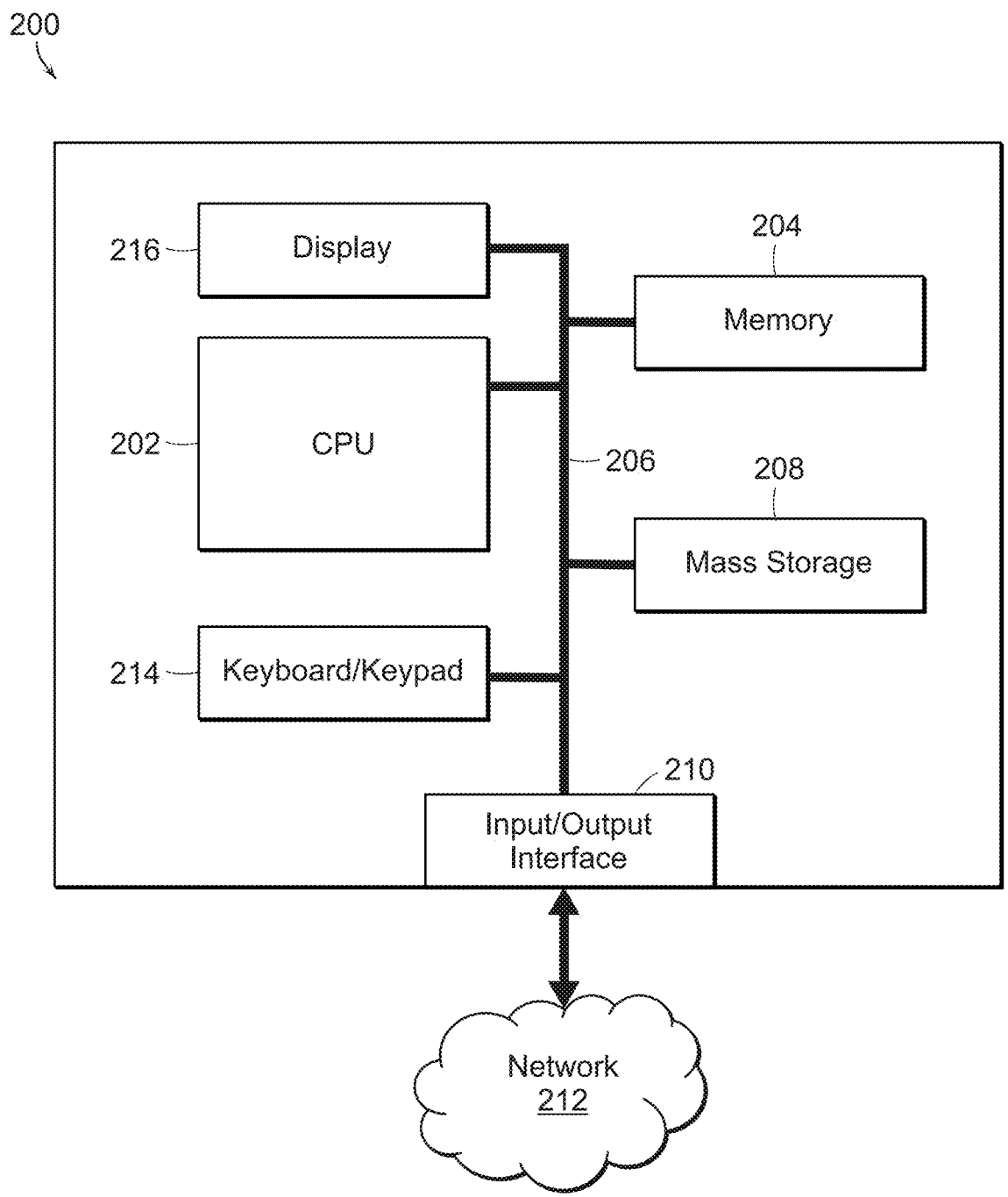
FIG. 2 is a block diagram of a computer system arranged to perform processing associated with a laser detection and ranging system.

FIG. 2 is block diagram of a computer system 200 arranged to perform processing associated with a LADAR system such as, for example, system 100 and laser transmitters 300 and 400, which are discussed in detail later herein. The exemplary computer system 200 includes a central processing unit (CPU) 202, a memory 204, and an interconnect bus 206. The CPU 202 may include a single microprocessor or a plurality of microprocessors or special purpose processors for configuring computer system 200 as a multi-processor system. The memory 204 illustratively includes a main memory and a read only memory. The computer 200 also includes the mass storage device 208 having, for example, various disk drives, tape drives, etc. The memory 204 also includes dynamic random access memory (DRAM) and high-speed cache memory. In operation, memory 204 stores at least portions of instructions and data for execution by the CPU 202. The memory 204 may also contain compute elements, such as Deep In-Memory Architectures (DIMA), wherein data is sent to memory and a function of the data (e.g., matrix vector multiplication) is read out by the CPU 202.

The mass storage 208 may include one or more magnetic disk, optical disk drives, and/or solid state memories, for storing data and instructions for use by the CPU 202. At least one component of the mass storage system 208, preferably in the form of a non-volatile disk drive, solid state, or tape drive, stores the database used for processing data and controlling functions of a laser transmitter of system 100, transmitter 300, or transmitter 400. The mass storage system 208 may also include one or more drives for various portable media, such as a floppy disk, flash drive, a compact disc read only memory (CD-ROM, DVD, CD-RW, and variants), memory stick, or an integrated circuit non-volatile memory adapter (i.e. PC-MCIA adapter) to input and output data and code to and from the computer system 200.

The computer system 200 may also include one or more input/output interfaces for communications, shown by way of example, as interface 210 and/or a transceiver for data communications via the network 212. The data interface 210 may be a modem, an Ethernet card or any other suitable data communications device. To provide the functions of a processor according to FIG. 1, the data interface 210 may provide a relatively high-speed link to a network 212, such as an intranet, internet, Aegis network, or the Internet, either directly or through another external interface. The communication link to the network 212 may be, for example, optical, wired, or wireless (e.g., via satellite or cellular network). The computer system 200 may also connect via the data interface 210 and network 212 to at least one other computer system to perform remote or distributed multi-sensor processing related to, for example, a common operational picture (COP). Alternatively, the computer system 200 may include a mainframe or other type of host computer system capable of Web-based communications via the network 212. The computer system 200 may include software for operating a network application such as a web server and/or web client.

The computer system 200 may also include suitable input/output ports, that may interface with a portable data storage device, or use the interconnect bus 206 for interconnection with a local display 216 and keyboard 214 or the like serving as a local user interface for programming and/or data retrieval purposes. The display 216 may include a touch screen capability to enable users to interface with the system 200 by touching portions of the surface of the display 216. Server operations personnel may interact with the system 200 for controlling and/or programming the system from remote terminal devices via the network 212.

The computer system 200 may run a variety of application programs and store associated data in a database of mass storage system 208. One or more such applications may include a waveform controller 302 or 402 such as described with respect to FIGS. 3 and 4.

The components contained in the computer system 200 may enable the computer system to be used as a server, workstation, personal computer, network terminal, mobile computing device, mobile telephone, System on a Chip (SoC), and the like. As discussed above, the computer system 200 may include one or more applications such as waveform control, streaming cross-correlations, artifact corrections, target acquisitions, and the tracking and discrimination of targets. The system 200 may include software and/or hardware that implements a web server application. The web server application may include software such as HTML, XML, WML, SGML, PHP (Hypertext Preprocessor), CGI, and like languages.

The foregoing features of the disclosure may be realized as a software component operating in the system 200 where the system 200 includes Unix workstation, a Windows workstation, a LINUX workstation, or other type of workstation. Other operation systems may be employed such as, without limitation, Windows, MAC OS, and LINUX. In some aspects, the software can optionally be implemented as a C language computer program, or a computer program written in any high level language including, without limitation, Javascript, Java, CSS, Python, Keras, TensorFlow, PHP, Ruby, C++, C, Shell, C#, Objective-C, Go, R, TeX, VimL, Perl, Scala, CoffeeScript, Emacs Lisp, Swift, Fortran, or Visual BASIC. Certain script-based programs may be employed such as XML, WML, PHP, and so on. The system 200 may use a digital signal processor (DSP).

As stated previously, the mass storage 208 may include a database. The database may be any suitable database system, including the commercially available Microsoft Access database, and can be a local or distributed database system. A database system may implement Sybase and/or a SQL Server. The database may be supported by any suitable persistent data memory, such as a hard disk drive, RAID system, tape drive system, floppy diskette, or any other suitable system. The system 200 may include a database that is integrated with the system 100, transmitter 300 and/or transmitter 400, however, it will be understood that, in other implementations, the database and mass storage 208 can be an external element.

In certain implementations, the system 200 may include an Internet browser program and/or be configured operate as a web server. In some configurations, the client and/or web server may be configured to recognize and interpret various network protocols that may be used by a client or server program. Commonly used protocols include Hypertext Transfer Protocol (HTTP), File Transfer Protocol (FTP), Telnet, and Secure Sockets Layer (SSL), and Transport Layer Security (TLS), for example. However, new protocols and revisions of existing protocols may be frequently introduced. Thus, in order to support a new or revised protocol, a new revision of the server and/or client application may be continuously developed and released.

In one implementation, the system 100 includes a networked-based, e.g., Internet-based, application that may be configured and run on the system 200 and/or any combination of the other components of the system 100. The computer system 200 may include a web server running a Web 2.0 application or the like. Web applications running on system 100 may use server-side dynamic content generation mechanisms such, without limitation, Java servlets, CGI, PHP, or ASP. In certain embodiments, mashed content may be generated by a web browser running, for example, client-side scripting including, without limitation, JavaScript and/or applets on a wireless device. In certain implementations, system 100 and/or 200 may include applications that employ asynchronous JavaScript+XML (Ajax) and like technologies that use asynchronous loading and content presentation techniques. These techniques may include, without limitation, XHTML and CSS for style presentation, document object model (DOM) API exposed by a web browser, asynchronous data exchange of XML data, and web browser side scripting, e.g., JavaScript. Certain web-based applications and services may utilize web protocols including, without limitation, the services-orientated access protocol (SOAP) and representational state transfer (REST). REST may utilize HTTP with XML.

The system 100, computer system 200, or another component of system 100 may also provide enhanced security and data encryption. Enhanced security may include access control, biometric authentication, cryptographic authentication, message integrity checking, encryption, digital rights management services, and/or other like security services. The security may include protocols such as IPSEC and IKE. The encryption may include, without limitation, DES, 3DES, AES, RSA, ECC, and any like public key or private key based schemes.

Figure 3:
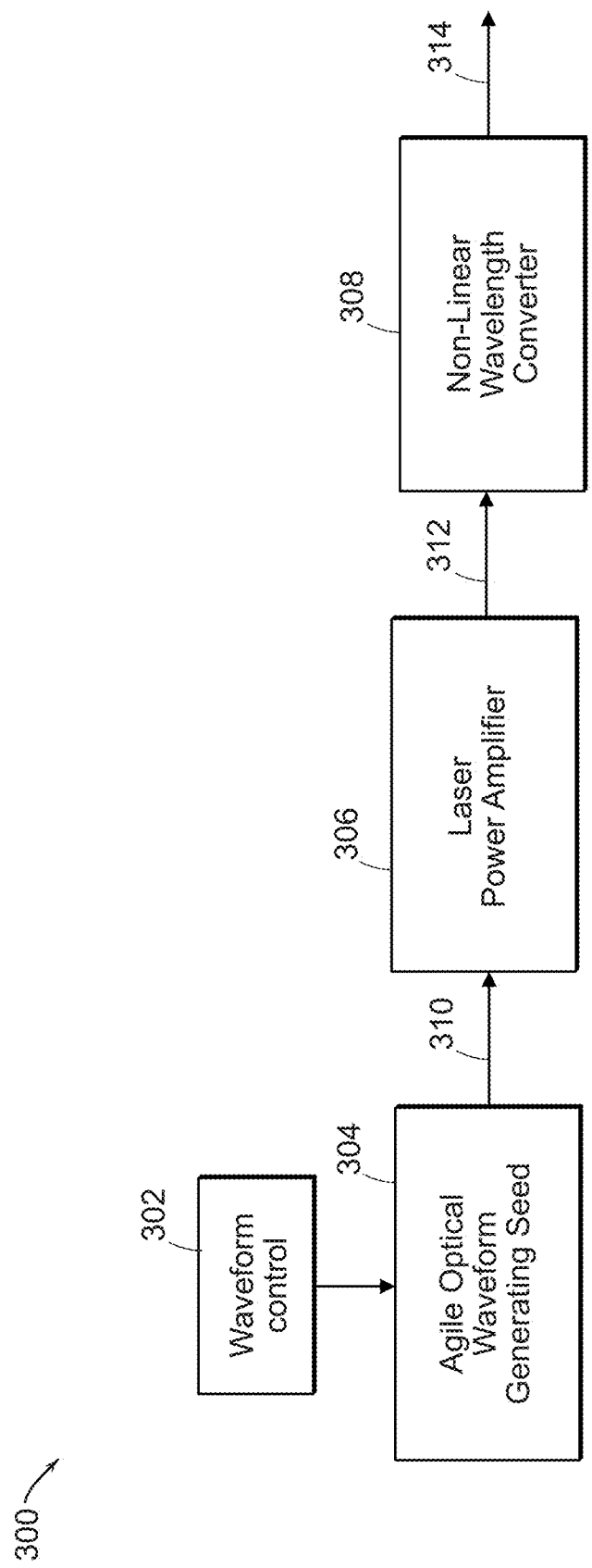
FIG. 3 is a block diagram of an exemplary laser transmitter.

FIG. 3 is a block diagram of an exemplary laser transmitter 300. Transmitter 300 may include a waveform controller 302, an agile optical waveform generating seed (AOWGS) 304, a laser power amplifier 306, and a non-linear wavelength converter 308. In operation, waveform controller 302 creates a waveform script that is used to electronically control AOWGS 304. The electronic waveform script may include PRF, pulse duration (or pulsewidth), and/or pulse amplitude pre-warp information. AOWGS 304 outputs an optical waveform signal 310 including pre-warped signal pulses that are input into laser power amplifier 306. After amplification, laser power amplifier 306, provides the desired optical waveform 312 including amplified signal pulses for optimal performance of nonlinear wavelength converter 308, which then emits laser pulses and/or wavelength-converted pulses 314.

Figure 4:
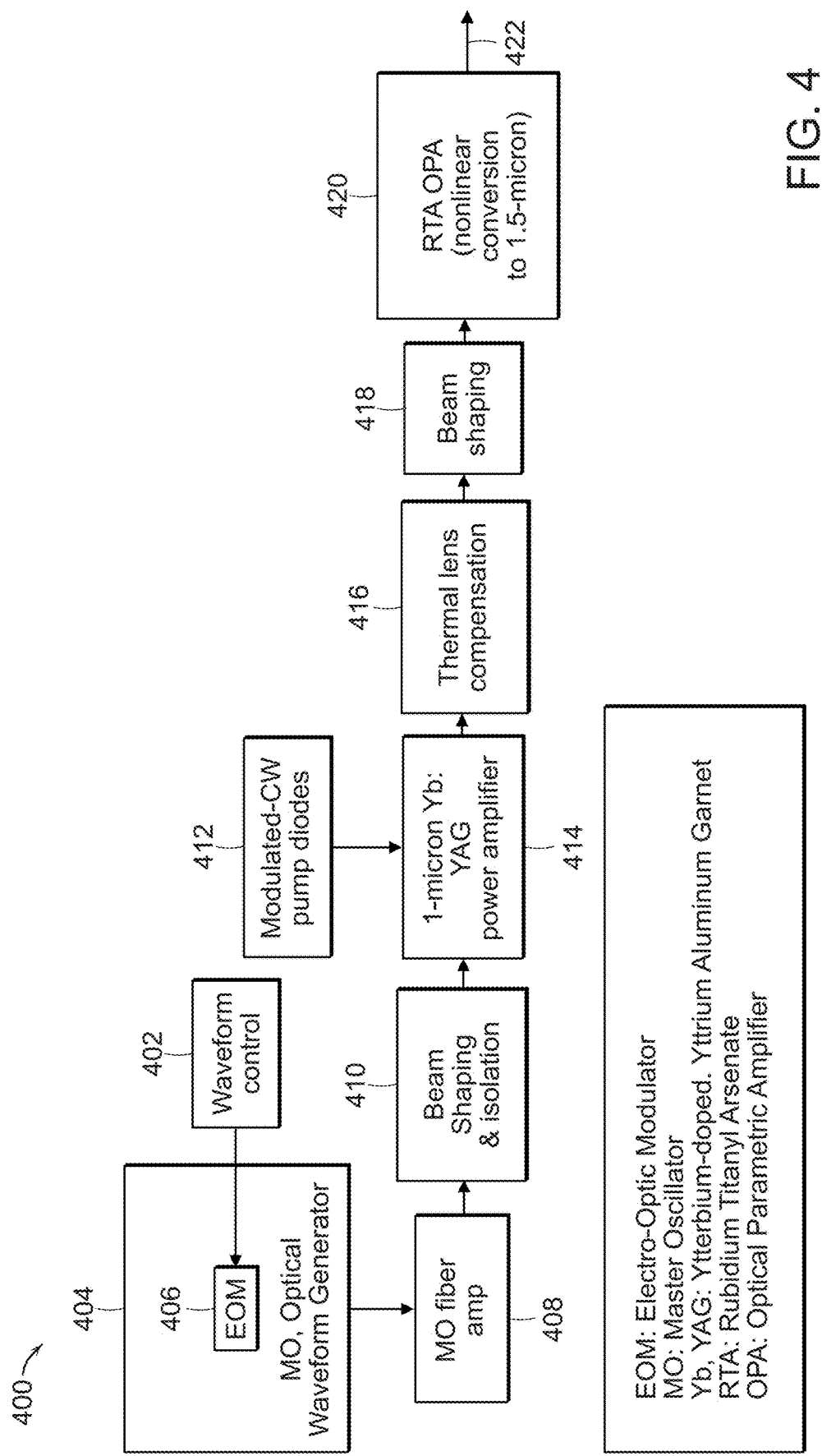
FIG. 4 is a block diagram of another exemplary laser transmitter.

FIG. 4 is a block diagram of another exemplary laser transmitter 400, which includes a waveform controller 402 and a master oscillator (MO) optical waveform generator 404. The MO optical waveform generator 404 may include a low power 1-micron distributed-feedback (DFB) diode laser that is amplitude-modulated using an electro-optic modulator (EOM) 406. Waveform control is performed electronically by waveform controller 402 controlling EOM 406. The optical signal generated by the EOM-modulated DFB output may be amplified using one or more Ytterbium-doped glass (Yb:glass) fiber amplifiers, represented by MO fiber amplifier element 408. Optical waveform generator (OWG) 404 and fiber amplifier 408 may be formed all in fiber. Fiber amplifier 408 may have a free-space output that is beam-shaped by beam shaping optics and isolation element 410 to efficiently couple into a 1-micron Yb-doped Yttrium Aluminum Garnet (Yb:YAG) power amplifier 414, which may include a planar-waveguide (PWG) amplifier.

Power amplifier 414 may be optically pumped using continuous-wave (CW) diodes with outputs in a wavelength band near 940 nm. The output of the diodes may be modulated to provide a burst of amplified optical pulses and/or amplified signal pulses from power amplifier 414, which is desirable in many LADAR scenarios. Active or passive thermal lens compensation via thermal lens compensation element 416 may be optionally used, but only to enable a variety of operational duty cycles for power amplifier 414. This compensation may be too slow to provide pulse-to-pulse adjustments in the incident beam area at the input to non-linear wavelength converter 420. In some implementations, the beam area incident on non-linear wavelength converter 420 is fixed during operation by beam shaping element 418. Non-linear wavelength converter 420 may include an optical parametric amplifier (OPA), which may include Rubidium Titanyl Arsenate (RTA) crystals. The OPA may be seeded with a low-power CW 1.5-micron DFB diode. The seed diode output power may be modulated to preclude transmitter emissions between signal pulses. Converter 420 may emit laser pulses and/or wavelength-converted pulses 422.

In an alternate implementation, Potassium Titanyl Arsenate (KTA) crystals are substituted for the RTA crystals in the OPA of converter 420. A Neodymium-doped YAG (Nd:YAG) gain medium may be substituted for the Yb:YAG, in power amplifier 414. With Nd:YAG, power amplifier 414 pump diodes operate either in a wavelength band around 808 nm or in a band around 885 nm. Additional implementations may include adding to or replacing the OPA of converter 420 with other nonlinear wavelength conversion devices such as, without limitation, a second-harmonic generator, a frequency tripler, and/or a Raman shifter.

Configuring transmitter 300 or 400 for optimum waveform control starts with setting the relationship between pulse duration ($\tau$) and PRF so that the optical pulses emitted from power amplifier 306 or 414 are maintained at a constant peak power. In some implementations, the amplifier average output power ($P_{avg}$) is also constant during LADAR transmitter operation. The power amplifier 306 or 414 output pulse energy ($E_p$) is then given by $$E_p = \frac{P_{avg}}{PRF} \qquad (1)$$

The value of $P_{avg}$ employed is often a characteristic of the capabilities of power amplifier 306 or 414. It is desirable to have some LADAR transmitter operating modes at the highest possible pulse energy, or alternatively from equation (1) above, to extend the minimum of the PRF range ($PRF_{min}$) to the smallest possible value. $PRF_{min}$ may be limited by factors that include the maximum peak power capability of, for example, fiber amp 408 and the fluorescence lifetime of the power amplifier 306 or 414 gain medium. The high end of the PRF range ($PRF_{max}$) may be limited by such factors as the maximum acquisition, or processing, rate capability of the LADAR receiver such as receiver 106.

It is also desirable to have some LADAR operating modes with the smallest possible pulse durations (Train). The minimum pulse duration Train may be limited by factors including the EOM 406 bandwidth of optical waveform generator 404. In order to maintain a constant peak power ($P_{peak}$) for the amplifier 306 or 414 output pulses, the pulse duration ($\tau$) may be varied as a function of PRF according to $$\tau = \frac{P_{avg}}{P_{peak} PRF} \xrightarrow{i.e.} \left\{ \tau \cdot PRF = \frac{P_{avg}}{P_{peak}} = \text{constant} \right\} \qquad (2)$$

In one implementation, $P_{peak}$ is set at the $\tau_{min}$, $PRF_{max}$ operating point, i.e.

$$P_{peak} = \frac{P_{avg}}{\tau_{min} PRF_{max}} \quad (3)$$

$\tau_{max}$ is then determined from $$\tau_{max} = \frac{P_{avg}}{P_{peak} PRF_{min}} = \left(\frac{PRF_{max}}{PRF_{min}}\right)\tau_{min} \quad (4)$$

The final step in this process is to configure the beam shaping optics between the power amplifier 306 and the nonlinear wavelength converter 308 in FIG. 3, or the beam shaping optics 418 in front of RTA OPA 420 in FIG. 4. The beam shaping optics transform the power amplifier 306 or 414 output beam dimensions to a beam size and shape corresponding to the required incident intensity ($I_{inc}$) at the nonlinear wavelength converter 308 or 420 respectively. The precise $I_{inc}$ required depends on the specifics of the design of wavelength converter 308 and 420 respectively. For the RTA OPA wavelength converter 420 depicted in FIG. 4, the required intensity ($I_{inc}$) may be about 500 MW/cm². The incident beam area ($A_{OPA}$) at the OPA 420 is then given by $$A_{OPA} = \frac{P_{peak}}{I_{inc}} \quad (5)$$

Figure 5:
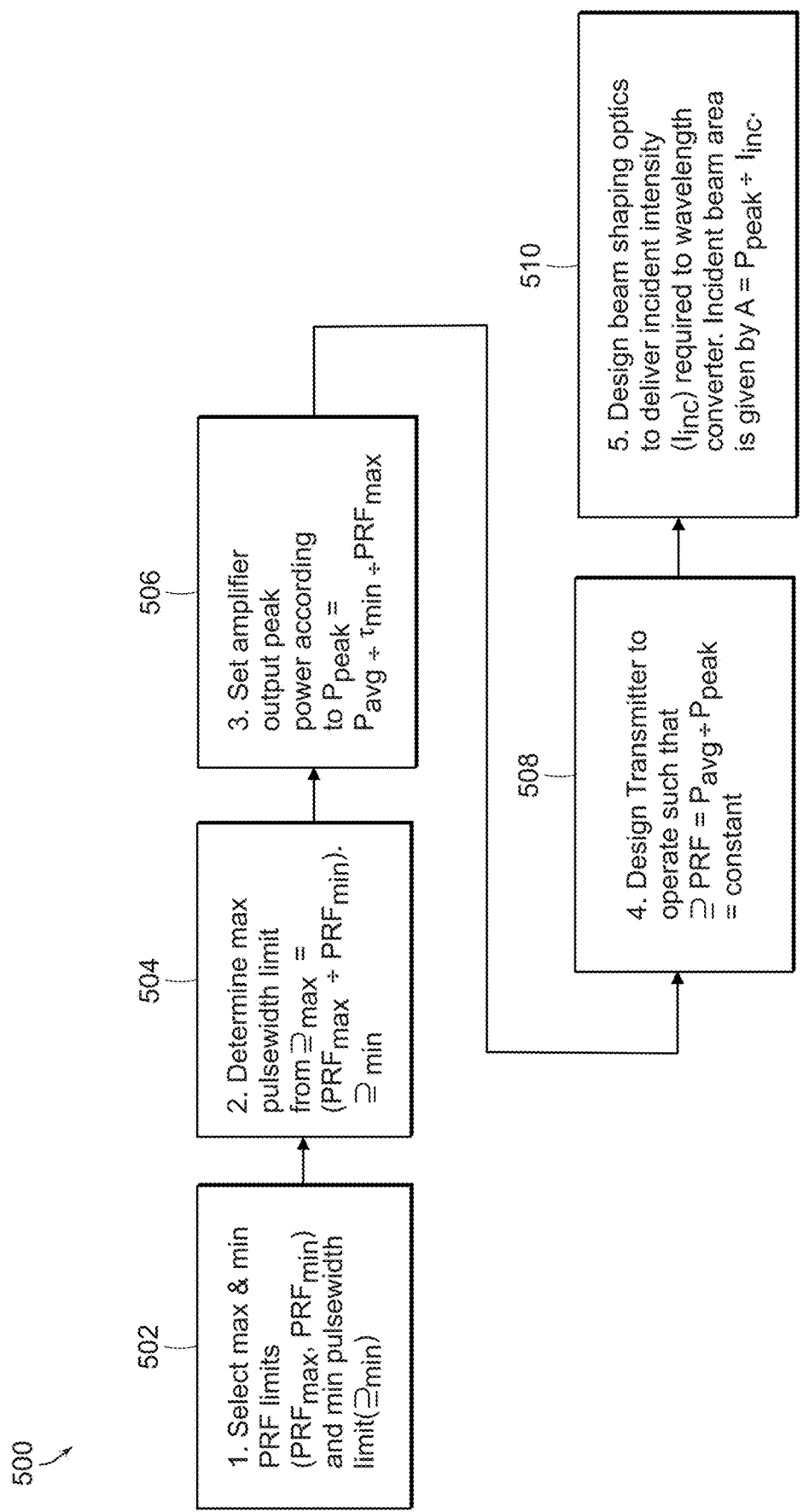
FIG. 5 is an exemplary process for controlling pulse repetition frequency (PRF) and pulsewidth.

FIG. 5 is an exemplary process 500 for controlling pulse repetition frequency (PRF) and pulsewidth in a laser transmitter such as transmitters 300 and 400. FIG. 5 summarizes the process steps described with respect to equations (1)-(5) above. First, waveform controller 302 or 402 selects maximum and minimum PRF limits and a minimum pulsewidth limit (Step 502). Waveform controller 302 or 402 determines a maximum pulsewidth limit according to equation (4) (Step 504). Power amplifier 306 or 414 output peak power is set according to equation (3) (Step 506). Waveform controller 302 or 402 configures transmitter 300 or 400 respectively to operate according to equation (2) (Step 508). Beam shaping optics are configured to deliver incident intensity to wavelength converter 308 or 420 according to equation (5) (Step 510).

Alternate implementations include setting $\tau_{max}$ in Step 502, determining minimum pulse duration using $\tau_{min} = PRF_{min} \div PRF_{max} \tau_{max}$ in Step 504, and setting amplifier 306 or 414 peak power using $P_{peak} = P_{avg} \div \tau_{max} \div PRF_{min}$ in Step 506. Steps 508 and 510 may be the same for all implementation.

An exemplary implementation is described as follows to further illustrate the waveform control configuration process. The operating parameters for this example case are listed in

TABLE 1

Operating parameters for example embodiment.

| Selected minimum PRF ($PRF_{min}$) | 15 kHz |
| Selected maximum PRF ($PRF_{max}$) | 65 kHz |
| Selected minimum pulse duration ($\tau_{min}$) | 0.80 ns |
| Calculated maximum pulse duration ($\tau_{max} = PRF_{max} \div PRF_{min} \cdot \tau_{min}$) | 3.47 ns |

TABLE 1-continued

Operating parameters for example embodiment.

| Selected maximum power amplifier average output power ($P_{avg}$) | 1000 W |
| Calculated amplifier output pulses peak power ($P_{peak} = P_{avg} \div \tau_{min} \div PRF_{max}$) | 19.23 MW |
| Wavelength-converter conversion efficiency at incident $P_{peak}$ | 40% |
| Wavelength converter output slope efficiency (Manley-Rowe) | 66% |

Figure 6A:
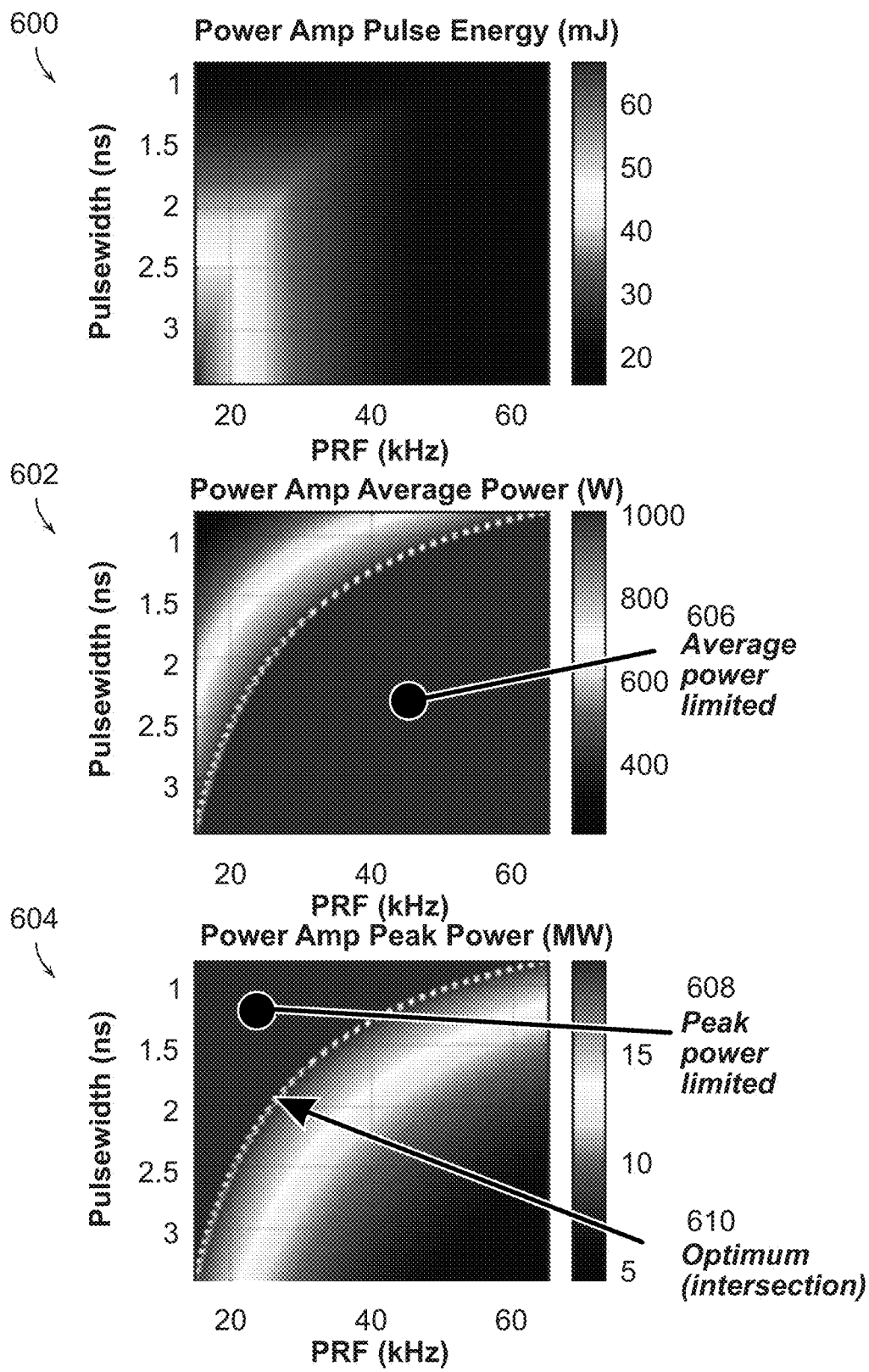
FIG. 6A shows graphs of power amplifier pulse energy, average power, and peak as a function of pulsewidth vs. PRF.
Figure 7A:
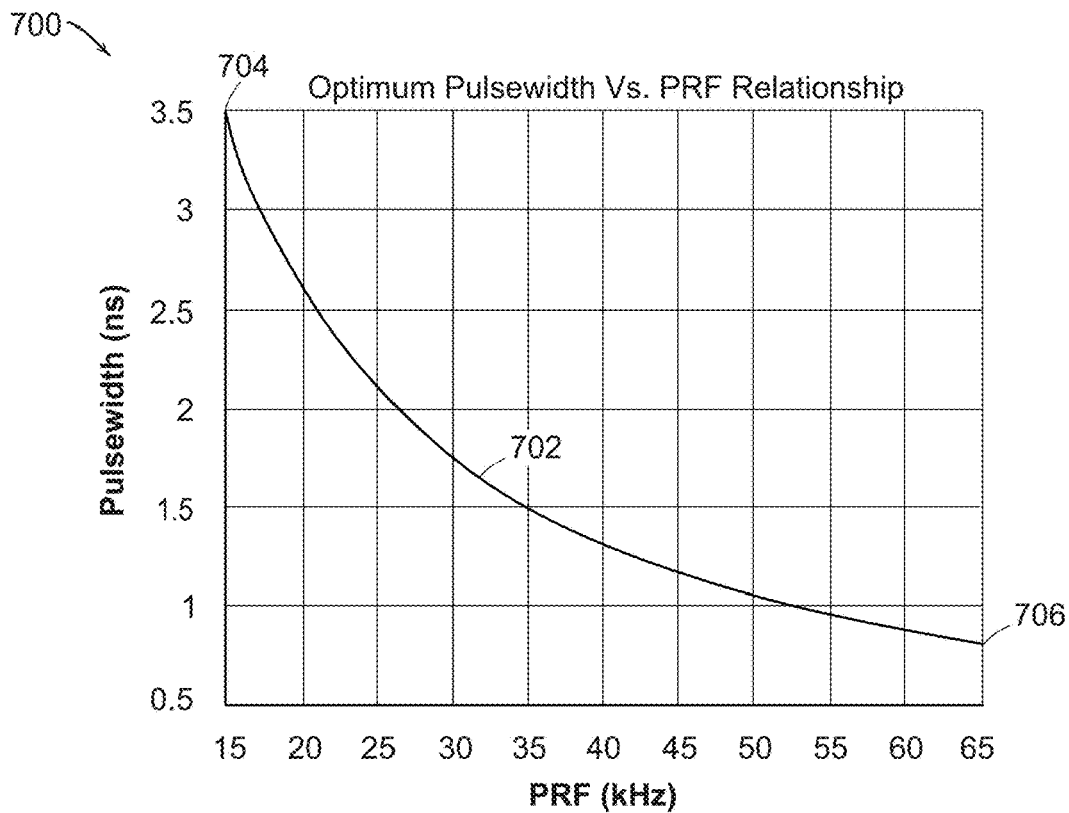
FIGS. 7A and 7B are plots of that illustrate an optimal PRF and pulse duration relationship.
Figure 7B:
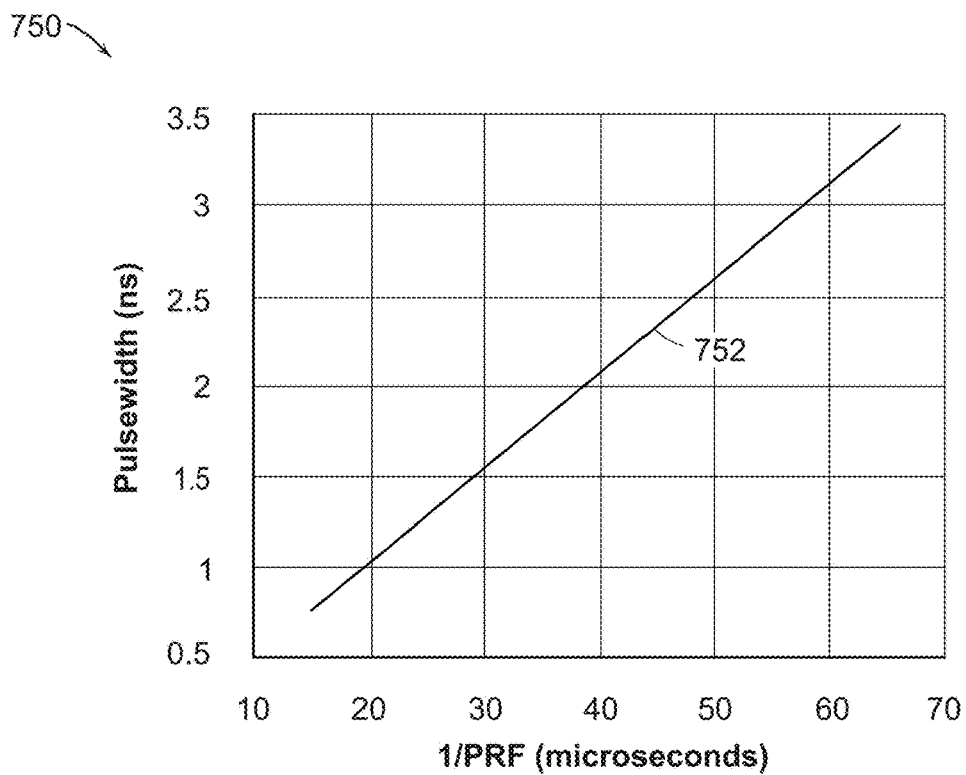

Power amplifier pulse energy, average power, and peak power are plotted in plots 600, 602 and 604 of FIG. 6A respectively as a function of pulse duration and PRF for the parameters given in Table 1. Optimum operation is at the intersection of the "average power limited" and "peak power limited" regions of the plots in FIG. 6A (depicted as a dashed white curve). Along this curve, both the amplifier average and peak output powers of amplifier 306 or 414 are maintained at a constant level, and the PRF, pulse duration relationship of equation (2) is satisfied. This optimum PRF, pulse duration curve 702 is also plotted in graph 700 of FIG. 7A. Point 704 is the long pulse, high pulse energy, low PRF position on curve 702 for a coarse detection mode. Point 706 is the short pulse, low pulse energy, high PRF position on curve 702 for an enhance resolution mode. The same curve (linear) 752 is plotted in graph 750 for pulse duration versus $PRF^{-1}$ pulse timing) in FIG. 7B. From equation (2), the slope of the linear curve in FIG. 7B is equal to $P_{avg}/P_{peak}=5.2\times10^{-5}$.

Figure 6B:
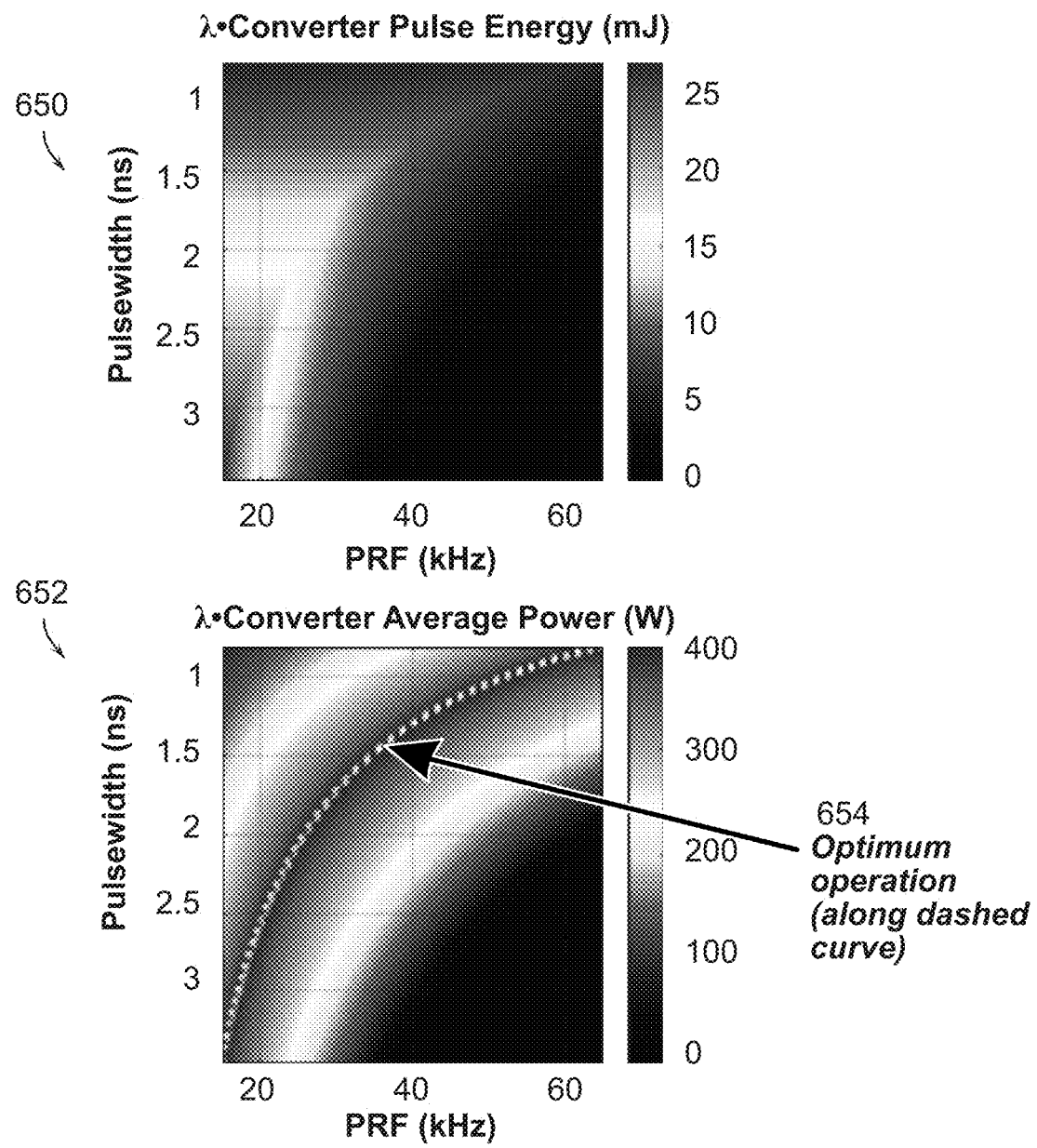
FIG. 6B shows graphs of wavelength converter pulse energy and average power as a function of pulsewidth vs. PRF.

A simulation was performed for conversion of the power amplifier output to the wavelength converter output wavelength. At the amplifier 414 output peak power setting ($P_{peak}$), the conversion efficiency is 40% in this simulation (Table 1). For amplifier peak powers away from the optimum setting, the wavelength converter slope efficiency is 66% (Manley-Rowe limit for 1 μm to 1.5 μm conversion). The results of the simulation are plotted in FIG. 6B in plots 650 and 652. Along the 'optimum' dashed curve 610 in the 2-D average power plot 652, the average output power of the wavelength converter is constant. Any PRF, pulse duration point such as points 606 and 608 away from curve 610 is less than optimum. The dashed curve 654 in plot 652 of FIG. 6B is identical to curve 610 in plot 604 of FIG. 6A.

The wide diversity of PRFs and pulsewidths enabled by this approach, as shown in FIGS. 6 and 7, allow a single transmitter such as transmitter 300 or 400 to be configured rapidly to satisfy a variety of functions and operating conditions. For instance, a low PRF—with correspondingly high pulse energy—is ideal for maximizing signal to noise ratio and minimizing ambiguity for coarse detection. At the opposite extreme, a high PRF and small pulsewidth is appropriate when enhanced resolution and motion sensitivity are desired. Intermediate settings can be leveraged in response to changes in operating conditions or functional requirements. The transmitter's ability to operate safely and effectively throughout this continuous spectrum of modes provides a previously unattainable degree of flexibility and adaptive control at the LADAR system level.

For optimum wavelength-converter performance, it may also be desirable to generate 'square' temporal pulses from power amplifier 306 or 414, each at the same peak power level. This means that the signal pulses from AOWGS 304 in FIG. 3 must be pre-warped to compensate for gain or 'square-pulse' distortion effects in power amplifier 306. The individual signal pulses 314 of a pulsed LADAR transmitter such as transmitter 300 may be of very short duration compared with the optical pump rate of power amplifier 306. For this reason, stored energy depletion results in a variation of amplifier gain over the duration of the signal pulse. The general form for calculating the required input pulse amplitude pre-warp, for a 'square' output pulse amplitude profile, is given by:

$$I_{in}(t) = \frac{I_{out}(t)}{1 + (G_0 - 1)\exp\left(-\frac{F_{out}(t)}{F_{sat}}\right)} \quad (6)$$

where $$F_{out}(t) = \int_{-\infty}^{t} I_{out}(s)ds$$

$I_{out}(t)$ is the desired output temporal intra-pulse intensity as a function of time t, $I_{in}(t)$ is the required input pulse intra-pulse intensity profile $I_{in}(t)$, $G_0$ is the small-signal gain of the amplifier 306 just prior to the arrival of the input pulse, and $F_{sat}$ is the saturation fluence of the gain medium of amplifier 306. For a 'square' output temporal pulse, $I_{out}(t)=I_{peak}$=constant, and $F_{out}(t)$ takes the form $F_{out}(t)=I_{peak}t$. Equation (6) can then be rewritten in terms of intra-pulse power as:

$$P_{in}(t) = \frac{P_{peak}}{1 + (G_0 - 1)\exp\left(-\frac{P_{peak}t}{E_{sat}}\right)} \quad (7)$$

where $P_{in}(t)=A_{PA}I_{in}(t)$ is the temporal profile of the input intra-pulse power, $A_{PA}$ is the transverse cross-sectional signal beam area of power amplifier 306, $P_{peak}=A_{PA}I_{peak}$=constant is the desired temporal profile of the output intra-pulse power, and $E_{sat} \equiv A_{PA}F_{sat}$.

Equation (7) represents the amplitude pre-warp function required for the input pulses to power amplifier 306 or 414 in order to produce 'square' output pulses. Often a LADAR transmitter incorporates a CW-pumped amplifier such as, for example, modulated-CW pump 412, which causes gain changes from pulse-to-pulse when the pulse timing is varied. It has been shown via simulation of a CW-pumped power amplifier that a single pre-warp function can be used for an entire PRF dither range.

$F_{sat}$ is a physical characteristic of the power amplifier gain medium. $E_{sat}$ is determined from $F_{sat}$ multiplied by the average cross-sectional area of the power amplifier. $P_{peak}$ is set as in Step 504 of FIG. 5. Both $E_{sat}$ and $P_{peak}$ are constants in this implementation. $G_0$ is used as a selectable parameter, and is also kept constant over the PRF dither range. Only the pulse duration ($\tau$) is varied as a function of PRF, using the relationship of equation (2). The input pulse energy $E_{in}$, as a function of the pulse duration ($\tau$), is determined from equation (7) by integrating over the pulse duration (0,$\tau$).

$$E_{in}(\tau) = \int_0^\tau P_{in}(t)dt = P_{peak} \int_0^\tau \frac{dt}{1 + (G_0 - 1)\exp\left(-\frac{P_{peak}t}{E_{sat}}\right)} = \quad (8)$$

$$P_{peak}\tau + E_{sat}\ln\left\{\frac{(G_0 - 1)\exp\left(\frac{P_{peak}\tau}{E_{sat}}\right) + 1}{G_0}\right\}$$

In one implementation, $G_0$ is set at the nominal PRF ($PRF_{nom}$) for the PRF dither range. The PRF is randomly varied around this nominal value. The input pulse energy at $PRF_{nom}$ is given by:

$$E_{nom} = \frac{P_{inavg}}{PRF_{nom}} \quad (9)$$

where $P_{inavg}$ is the average input seed power to the power amplifier. $G_0$ is then determined by solving equation (8):

$$G_0 = \frac{\exp\left(\frac{P_{peak}\tau_{nom}}{E_{sat}}\right) - 1}{\exp\left(\frac{E_{nom}}{E_{sat}}\right) - 1} \quad (10)$$

where $\tau_{nom}$ corresponds to $PRF_{nom}$ from equation (2).

Figure 8:
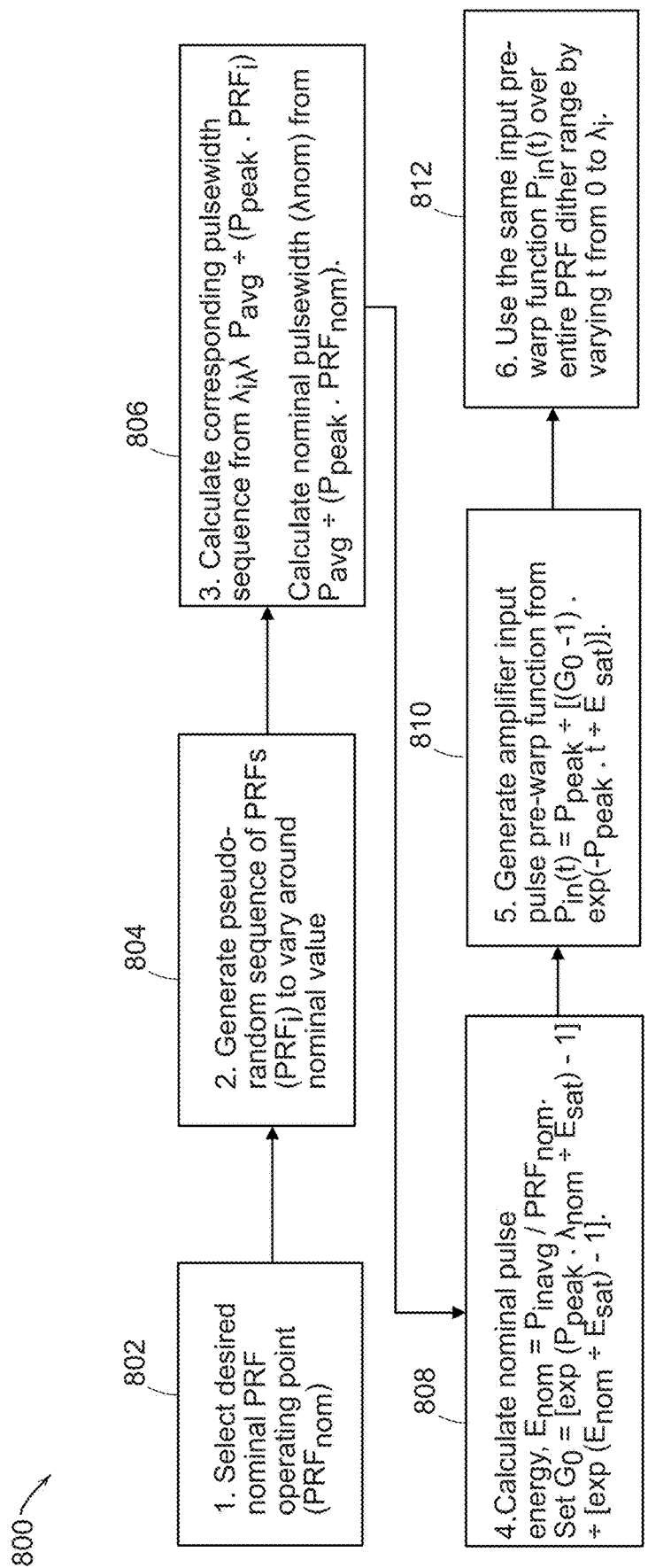
FIG. 8 is an exemplary process for controlling rapid PRF dithering.

The process steps for performing PRF dithering, for one implementation, are summarized in FIG. 8. First, waveform controller 302 or 402 selects a desired nominal PRF operating point $PRF_{nom}$ (Step 802). Waveform controller 302 or 402 generates a pseudo-random sequence of PRFs to vary around the nominal value. Controller 302 or 402 may provide the sequence information to AOWGS 304 or OWG 404 including EOM 406 and/or MO fiber amplifier 408 respectively via a waveform script to enable AOWGS 304 or OWG 404 and/or MO fiber amplifier 408 to generate the pseudo-random sequence of PRFs (Step 804). Waveform controller 302 or 402 may calculate a corresponding pulsewidth sequence and nominal pulsewidth. Controller 302 and 402 may provide the pulsewidth sequence and nominal pulsewidth information via a waveform script to AOWGS 304 or OWG 404 including EOM 406 and/or MO fiber amplifier 408 (Step 806). Controller 302 or 402 may calculate nominal pulse energy according to equation (8) (Step 808). Amplifier input pulse pre-warp function may be generated according to equation (7) (Step 810). Transmitter 300 or 400 may use the same input pre-warp function over the entire PRF dithering range (Step 812).

The following describes a power amplifier simulation that was conducted to illustrate the pulse waveform control process 800 in FIG. 8. The power amplifier configuration used in the simulation includes a single-pass 1-micron, end-pumped Yb:YAG PWG with a core tapered in the fast axis. The characteristics of this power amplifier design are given in required from the optical waveform generator 404.

The saturation energy ($E_{sat}$) was calculated from the Yb:YAG saturation fluence ($F_{sat}$) using the average transverse (cross-sectional) area of the core.

The PRF-dither parameters are listed in. below. A sequence of PRFs ($PRF_i$) was generated over a 4 ms duration, by randomly varying the PRF values over the range $PRF_{nom} \pm \Delta PRF$. A corresponding sequence of pulse durations (TO was generated from the PRF sequence by employing equation (2). A single pre-warp function was used, e.g., based on equation (7), for all of the pulses. The nominal pulse energy, pulse duration, and $G_0$ parameters were determined from equations (9), (2), and (10), respectively. The simulation results for pulse waveform control per this implementation are plotted in plots 950, 1050, 1150, 1250, 1350, 1360, and 1450 of FIGS. 9B, 10B, 11B, 12B, 13B, and 14B respectively. For comparison, plots 900, 1000, 1100, 1200, 1300, 1310, and 1400 of FIGS. 9A, 10A, 11A, 12A, 13A, and 14A respectively are simulation results where only a single pulse duration value ($\tau_{nom}$) was used for all input pulses in the PRF-dither range.

Figure 9A:
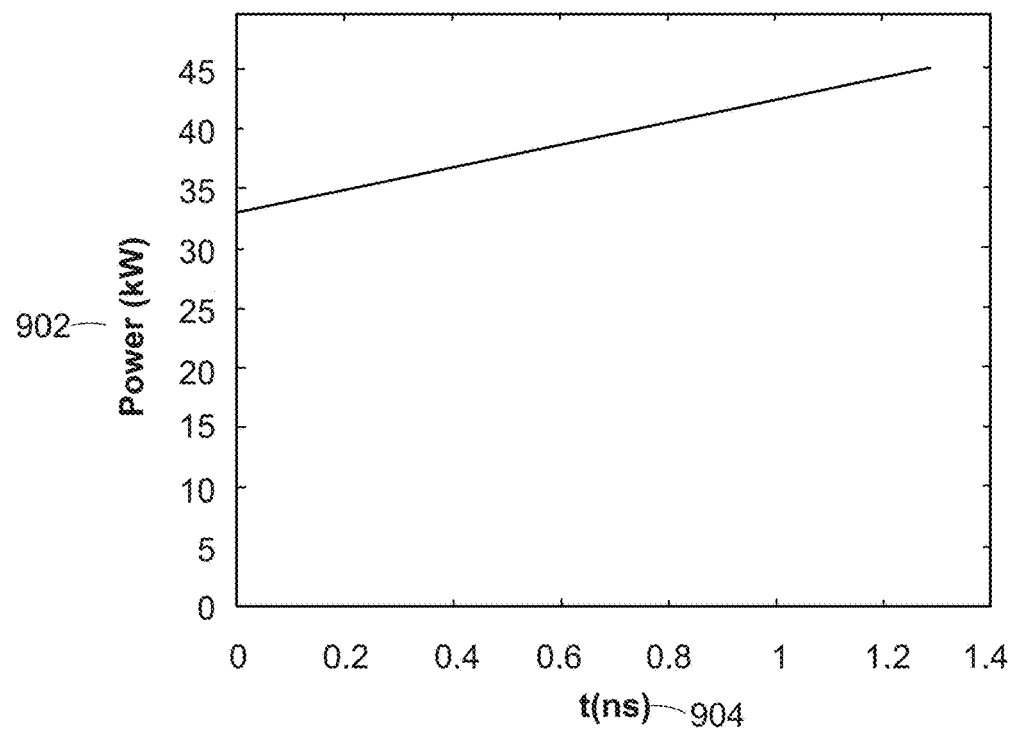
FIGS. 9A and 9B are plots of power amplifier input pulse power vs. time for a fixed input pulse duration and with waveform control respectively.
Figure 9B:
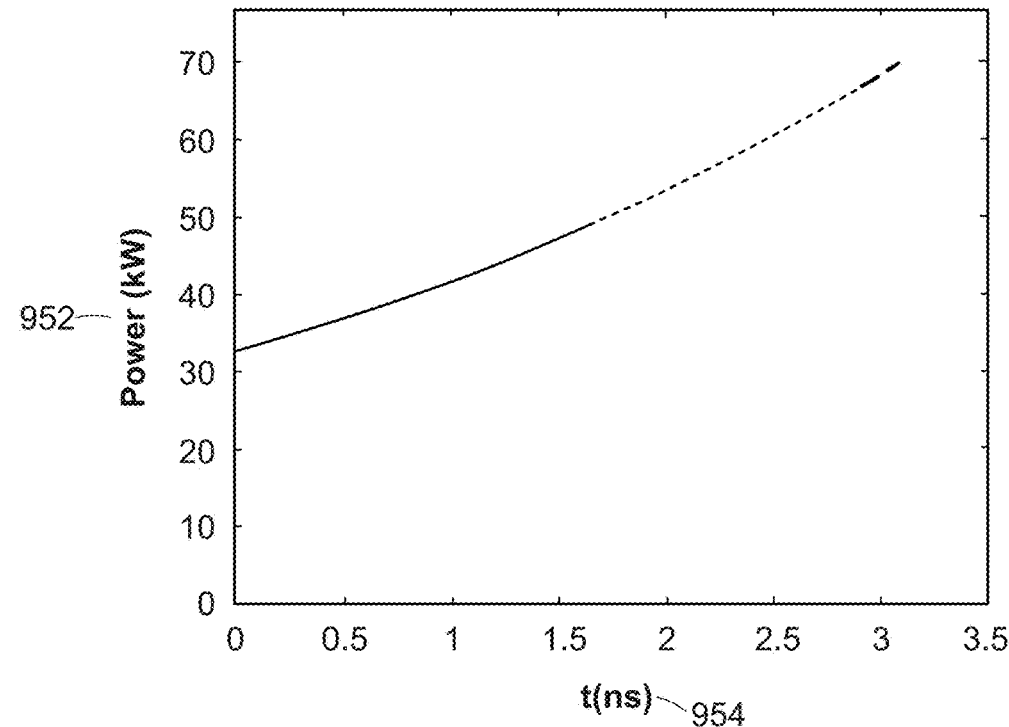
Figure 10A:
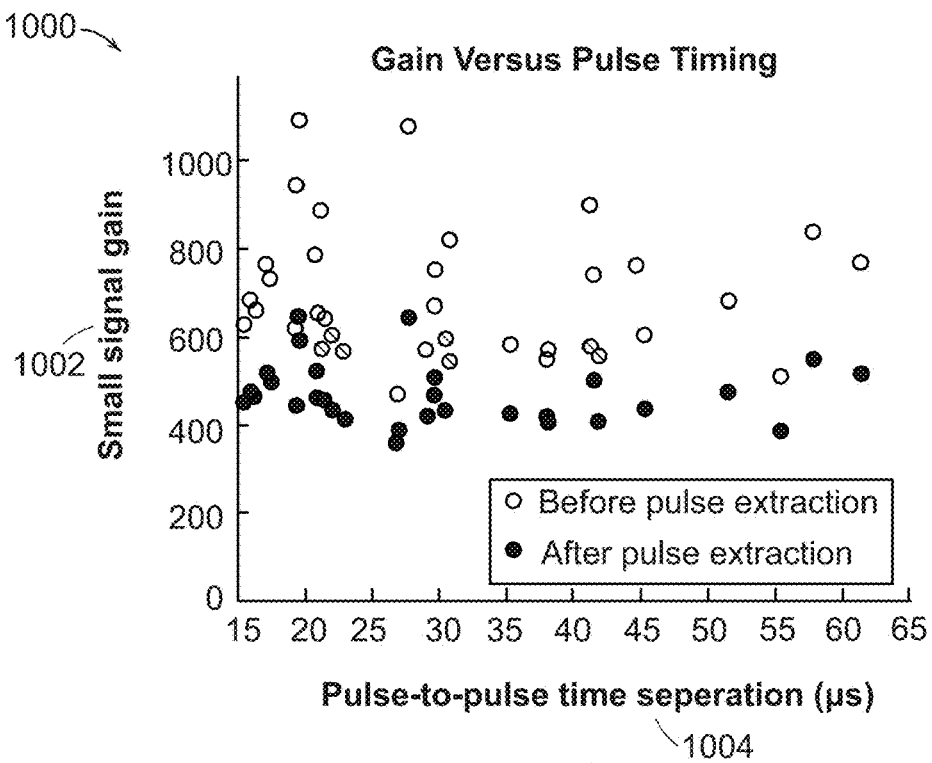
FIGS. 10A and 10B are plots of power amplifier gain vs. pulse timing for a fixed input pulse duration and with waveform control respectively.
Figure 10B:
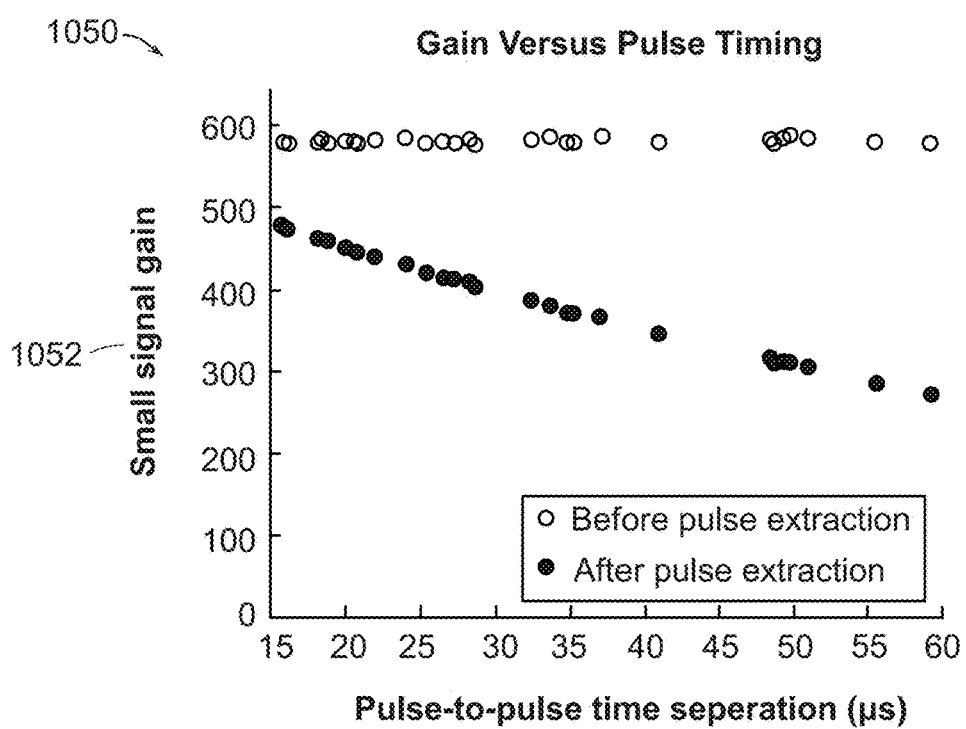
Figure 11A:
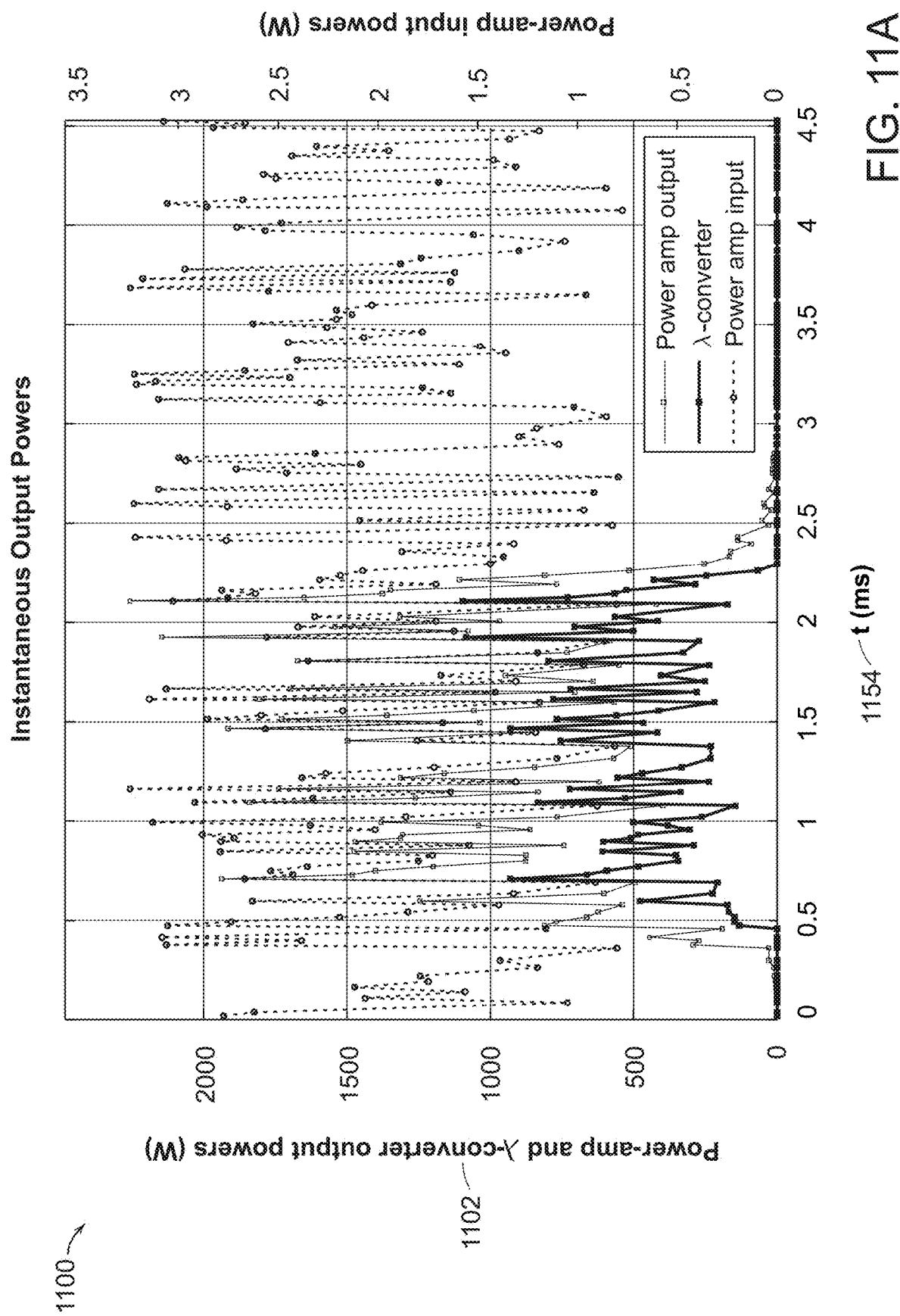
FIGS. 11A and 11B are plots of power amplifier and wavelength converter instantaneous output power vs. time for a fixed input pulse duration and with waveform control respectively.
Figure 11B:
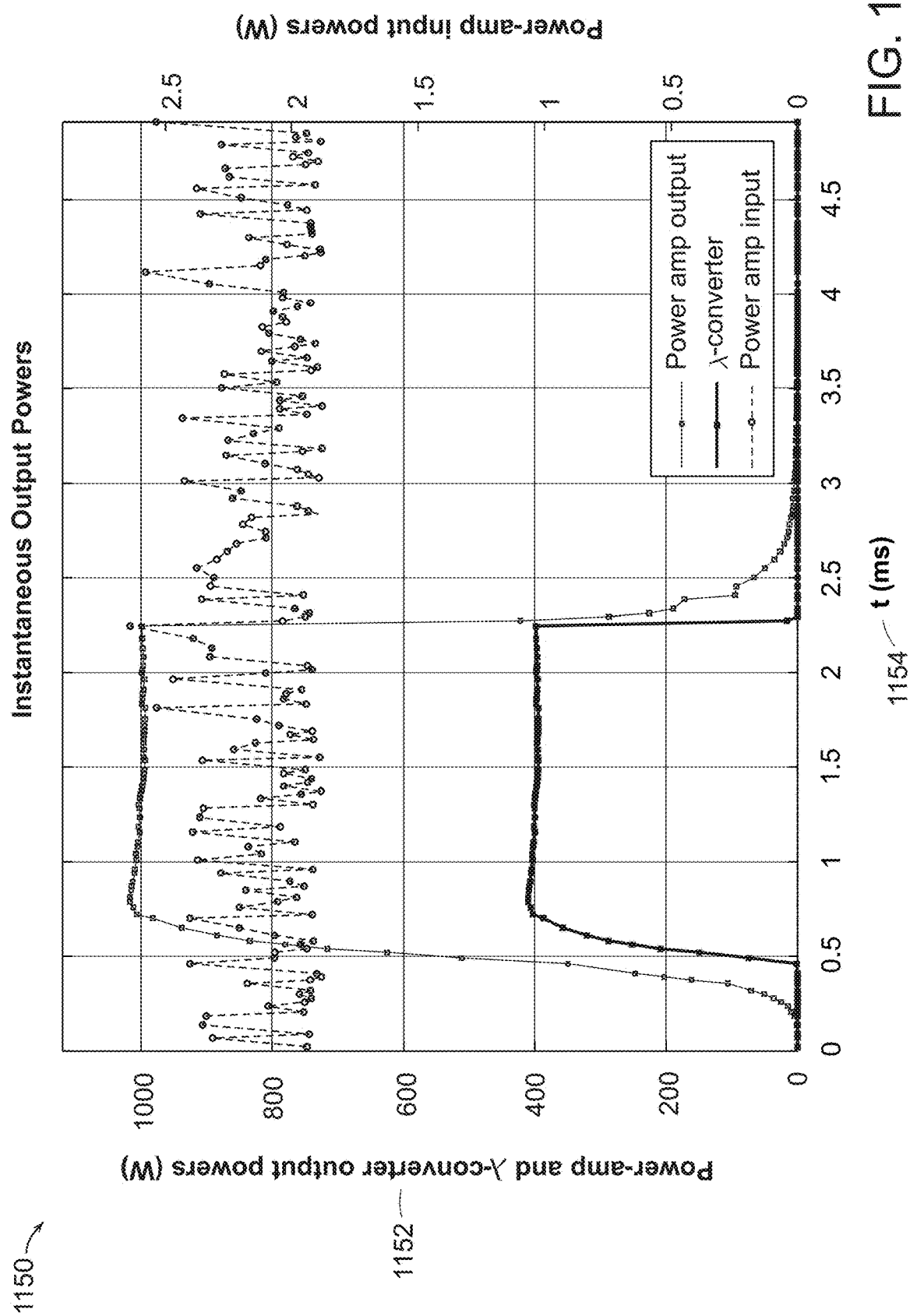
Figure 12A:
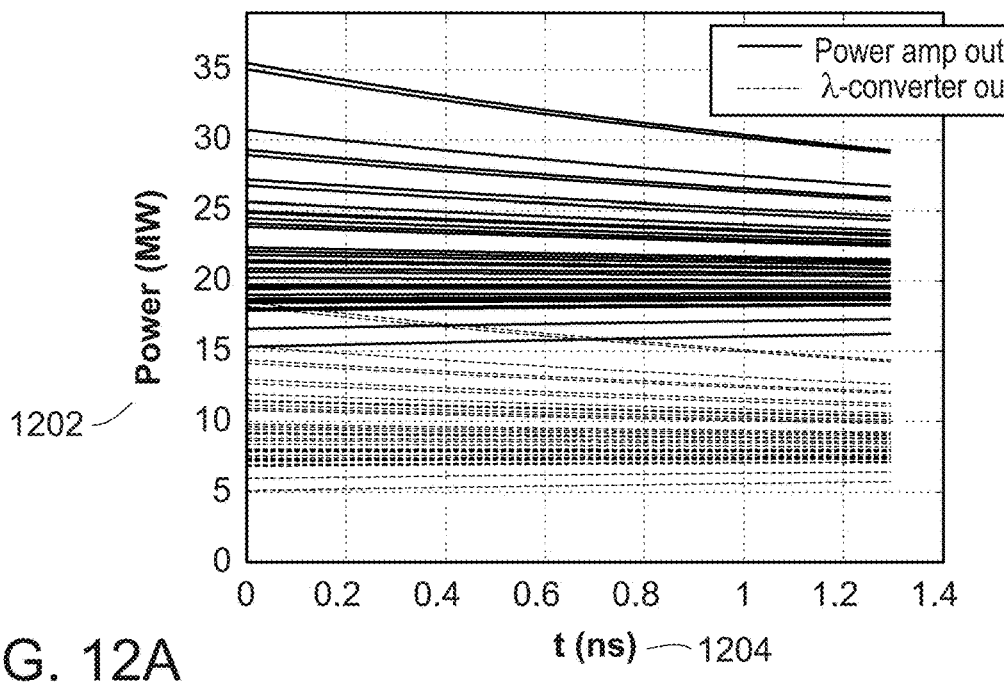
FIGS. 12A and 12B are plots of power amplifier and wavelength converter intra-pulse output power vs. time for a fixed input pulse duration and with waveform control respectively.
Figure 12B:
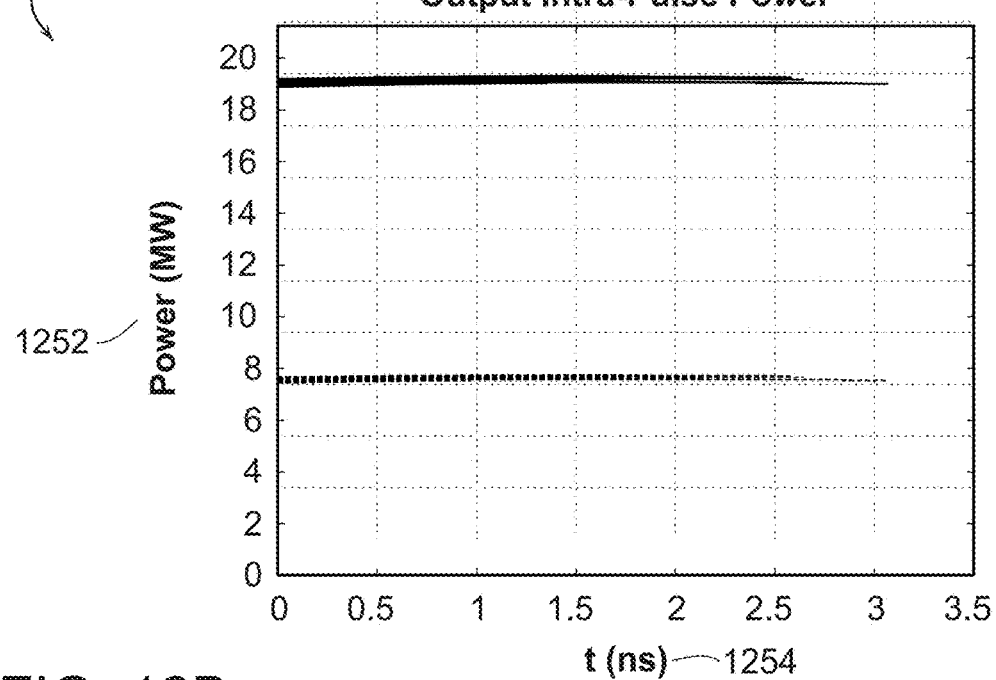
Figure 13A:
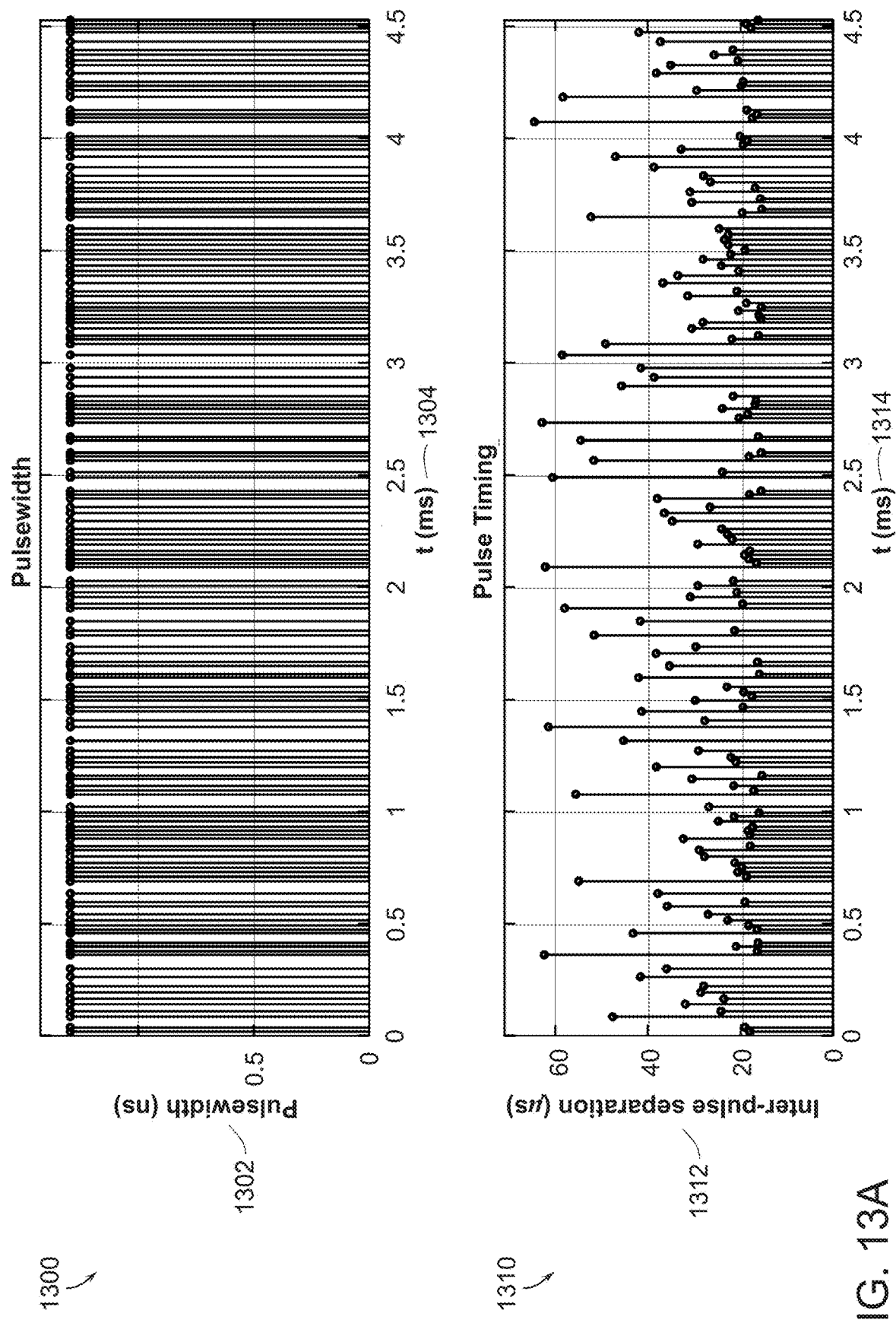
FIG. 13A shows plots of pulsewidth and pulse separation vs. time for a fixed input pulse duration respectively.
Figure 13B:
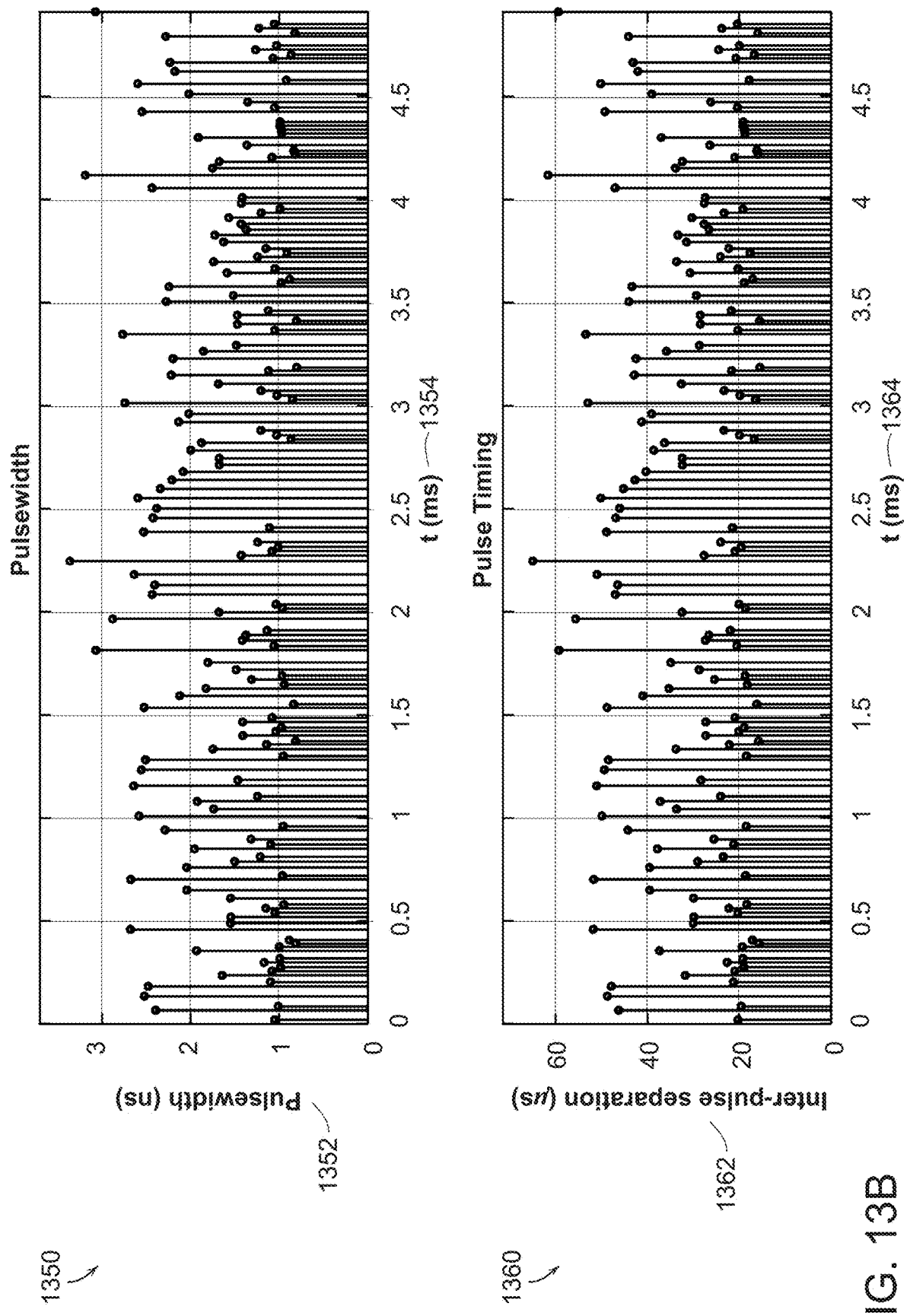
FIG. 13B shows plots of pulsewidth and pulse separation vs. time with waveform control respectively.
Figure 14A:
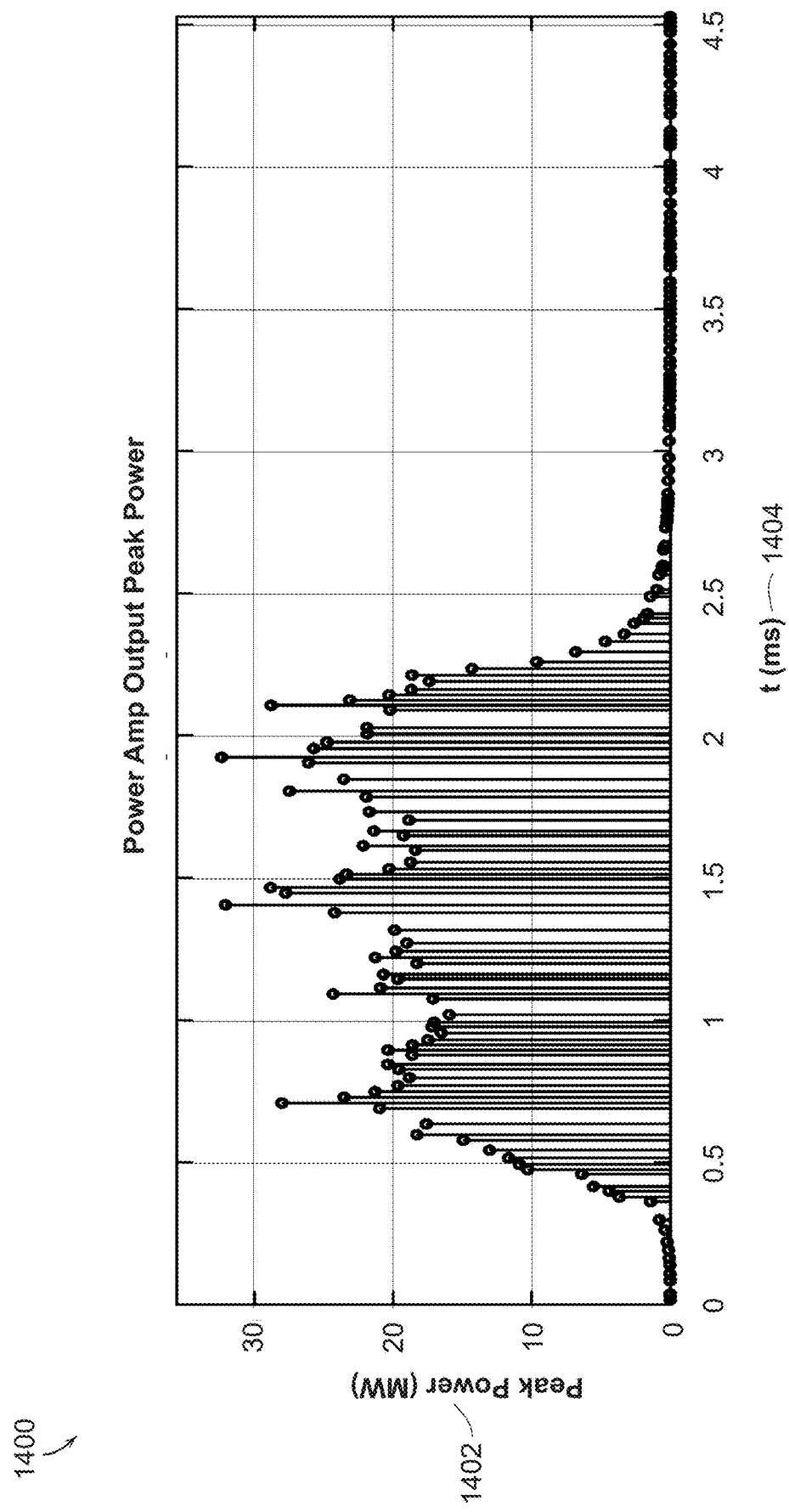
FIGS. 14A and 14B are plots of power amplifier output peak power vs. time for a fixed input pulse duration and with waveform control respectively.
Figure 14B:
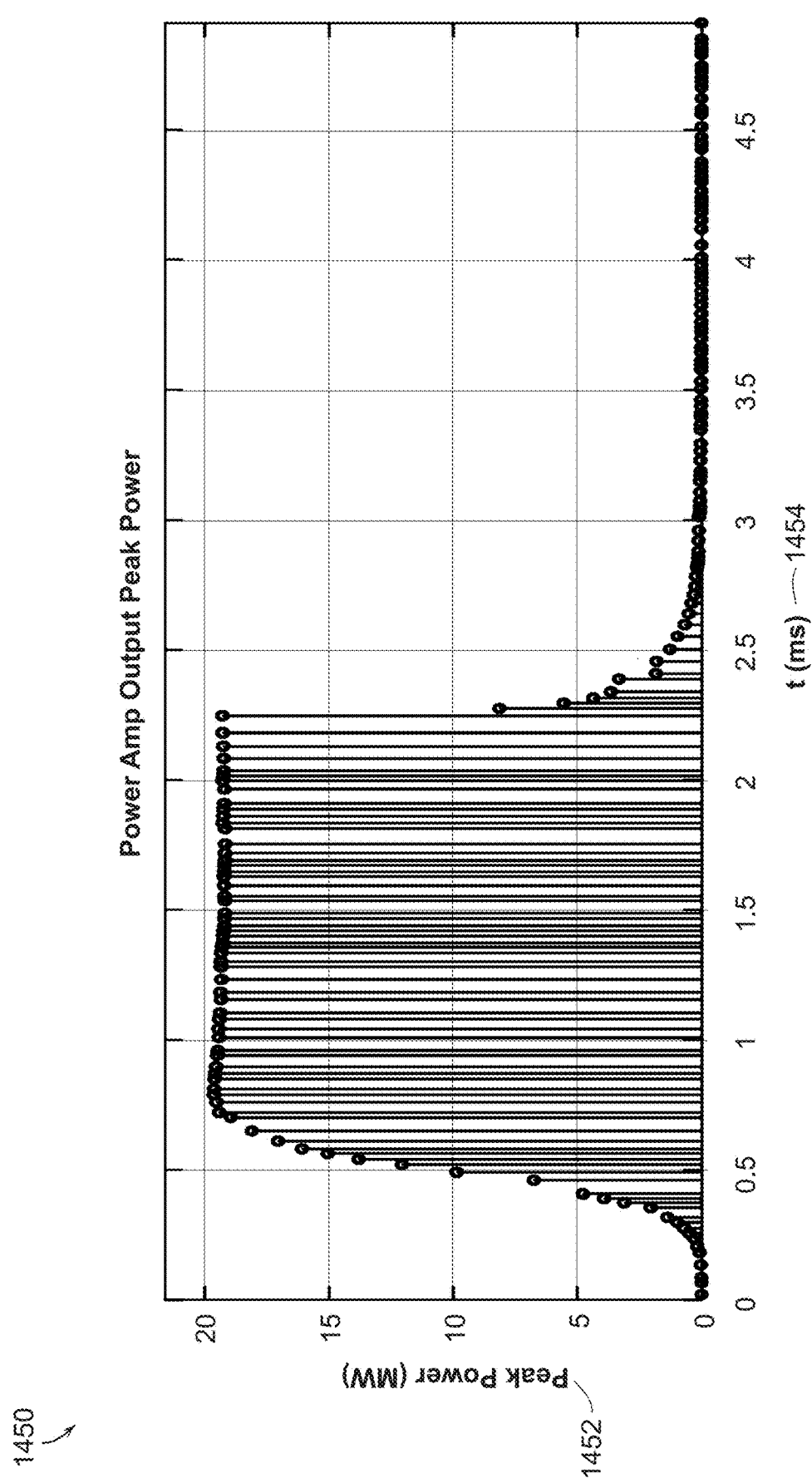

FIGS. 9A and 9B are plots 900 and 950 of power amplifier input pulse power 902 and 952 vs. time 904 and 954 for a fixed input pulse duration and with waveform control respectively. FIGS. 10A and 10B are plots 1000 and 1050 of power amplifier gain 1002 and 1052 vs. pulse timing 1004 and 1054 for a fixed input pulse duration and with waveform control respectively. FIGS. 11A and 11B are plots 1100 and 1150 of power amplifier and wavelength converter instantaneous output power 1102 and 1152 vs. time 1104 and 1154 for a fixed input pulse duration and with waveform control respectively. FIGS. 12A and 12B are plots 1200 and 1250 of power amplifier and wavelength converter intra-pulse output power 1202 and 1252 vs. time 1204 and 1254 for a fixed input pulse duration and with waveform control respectively. FIG. 13A shows plots 1300 and 1310 of pulsewidth 1302 and pulse separation 1312 vs. time 1304 and 1314 for a fixed input pulse duration respectively. FIG. 13B shows plots 1350 and 1360 of pulsewidth 1352 and pulse separation 1362 vs. time 1354 and 1364 with waveform control respectively. FIGS. 14A and 14B are plots 1400 and 1450 of power amplifier output peak power 1402 and 1452 vs. time 1404 and 1454 for a fixed input pulse duration and with waveform control respectively.

The pre-warp function described herein, applies to the input of power amplifiers 306 and 414 in transmitters 300 and 400 of FIGS. 3 and 4 respectively. In the implementation of FIG. 4, MO fiber amplifier 408 can also produce gain distortion. Therefore, equation (6) may have to be further employed, using the characteristics of the fiber amplifier(s), to transform the required power amplifier input pre-warp function into the pre-warp waveform that is required from the optical waveform generator 404.

TABLE 2

Power amplifier characteristics for pulse waveform control simulation.

| | |
|---|---|
| Signal wavelength | 1030 nm |
| Pump wavelength | 940 nm |
| Core material | 2% Yb:YAG |
| Clad material | Undoped YAG |
| Gain saturation fluence ($F_{sat}$) | 9.725 J/cm$^2$ |
| Average transverse area of power amplifier core (A) | 8.02 × 10$^{-3}$ cm$^2$ |
| Power amplifier saturation energy ($E_{sat} = AF_{sat}$) | 78 mJ |
| Core fast-axis dimension at input | 67.5 μm |
| Core fast-axis dimension at output | 133 μm |
| Core slow-axis dimension | 8 mm |
| Core length | 78 mm |
| Clad fast-axis dimension | 800 μm |
| Clad slow-axis dimension | 8 mm |
| Power amplifier peak pump power | 2180 W |
| Power amplifier pump pulse duration | 2.2 ms |
| Power amplifier signal output peak average power | 1000 W (an output of the simulation) |
| Signal input nominal average power | 2 W (continuous) |

TABLE 3

PRF-dither simulation parameters.

| Parameters | Values |
|---|---|
| Nominal PRF (PRF$_{nom}$) | 40 kHz |
| PRF dither range around nominal ($\Delta$PRF) | ±25 kHz |
| Power amplifier output intra-pulse peak power ($P_{peak}$) | 19.23 MW |
| Nominal input pulse energy, from equation (9) | 50 μJ |
| Nominal signal pulse duration, from equation (2) | 1.30 ns |
| G$_0$, from equation (10) | 587 |

It will be apparent to those of ordinary skill in the art that certain aspects involved in the operation of the system 100, transmitters 300 and 400, or other devices may be embodied in a computer program product that includes a computer usable and/or readable medium. For example, such a computer usable medium may consist of a read only memory device, such as a CD ROM disk or conventional ROM devices, or a random access memory, such as a hard drive device or a computer diskette, or flash memory device having a computer readable program code stored thereon.

Elements or steps of different implementations described may be combined to form other implementations not specifically set forth previously. Elements or steps may be left out of the systems or processes described previously without adversely affecting their operation or the operation of the system in general. Furthermore, various separate elements or steps may be combined into one or more individual elements or steps to perform the functions described in this specification.

Other implementations not specifically described in this specification are also within the scope of the following claims.

What is claimed is:

1. A laser transmitter comprising:
    a waveform controller arranged to generate a waveform script, wherein the waveform script includes at least one of a pulse repetition frequency setting, a pulse duration setting, and a pulse amplitude pre-warp setting and wherein the waveform controller adjusts at least one setting of the waveform script to implement waveform dithering;
    an optical waveform generator arranged to: i) receive the waveform script, ii) generate pre-warped signal pulses based on the waveform script to compensate for gain distortion effects of a laser power amplifier, and iii) output the pre-warped signal pulses;
    the laser power amplifier arranged to: i) receive the pre-warped signal pulses, ii) receive a continuous wave signal, and iii) output amplified signal pulses that maintain a substantially constant drive intensity at the input of a non-linear wavelength converter; and
    the non-linear wavelength converter arranged to receive the amplified signal pulses and emit wavelength-converted pulses.

2. The transmitter of claim 1, wherein the pulse duration setting is a function of the pulse repetition frequency setting.

3. The transmitter of claim 2, wherein the pulse duration setting is inversely proportional to the pulse repetition frequency setting.

4. The transmitter of claim 1, wherein the waveform controller adjusts the pulse duration setting and pulse repetition frequency setting over a range of pulse repetition frequencies to maintain a substantially constant peak power of the amplified signal pulses from the laser power amplifier.

5. The transmitter of claim 1, wherein the waveform controller adjusts the pulse amplitude pre-warp setting to configure the laser power amplifier to generate substantially square amplified pulse signals.

6. The transmitter of claim 1, wherein the waveform controller selects a nominal pulse repetition frequency setting and generates a pseudo-random sequence of pulse repetitions frequencies that vary around the nominal pulse repetition frequency setting.

7. The transmitter of claim 6, wherein the waveform controller generates a sequence of pulse durations for the amplified signal pulses corresponding to the pseudo-random sequence of pulse repetition frequencies.

8. The transmitter of claim 7, wherein the waveform controller generates the sequence of pulse durations and the pseudo-random sequence of pulse repetition frequencies based on a pre-warp function used for all of the amplified signal pulses.

9. The transmitter of claim 1, wherein the waveform controller is arranged to adjust the pulse repetition frequency setting over a range of about 15 kHz to 65 kHz in real time.

10. A method for laser transmission comprising:
generating a waveform script, wherein the waveform script includes at least one of a pulse repetition frequency setting, a pulse duration setting, and a pulse amplitude pre-warp setting;
generating pre-warped signal pulses based on the waveform script to compensate for gain distortion effects of a laser power amplifier;
receiving, at the laser power amplifier, a continuous wave signal;
generating, from the laser power amplifier, amplified signal pulses that maintain a substantially constant drive intensity at the input of a non-linear wavelength converter; and
outputting, from the non-linear wavelength converter, wavelength-converted pulses; and
adjusting at least one setting of the waveform script to implement waveform dithering.

11. The method of claim 10, wherein the pulse duration setting is a function of the pulse repetition frequency setting.

12. The method of claim 11, wherein the pulse duration setting is inversely proportional to the pulse repetition frequency setting.

13. The method of claim 10 comprising adjusting the pulse duration setting and pulse repetition frequency setting over a range of pulse repetition frequencies to maintain a substantially constant peak power of the amplified signal pulses from the laser power amplifier.

14. The method of claim 10 comprising adjusting the pulse amplitude pre-warp setting to configure the laser power amplifier to generate substantially square amplified pulse signals.

15. The method of claim 10 comprising selecting a nominal pulse repetition frequency setting and generating a pseudo-random sequence of pulse repetitions frequencies that vary around the nominal pulse repetition frequency setting.

16. The method of claim 15 comprising generating a sequence of pulse durations for the amplified signal pulses corresponding to the pseudo-random sequence of pulse repetition frequencies.

17. The method of claim 16 comprising generating the sequence of pulse durations and the pseudo-random sequence of pulse repetition frequencies based on a pre-warp function used for all of the amplified signal pulses.

18. A laser detection and ranging system comprising:
a laser transmitter including:
    a waveform controller arranged to generate a waveform script, wherein the waveform script includes at least one of a pulse repetition frequency setting, a pulse duration setting, and a pulse amplitude pre-warp setting and wherein the waveform controller adjusts at least one setting of the waveform script to implement waveform dithering;
    an optical waveform generator arranged to: i) receive the waveform script, ii) generate pre-warped signal pulses based on the waveform script to compensate for gain distortion effects of a laser power amplifier, and iii) output the pre-warped signal pulses;
    the laser power amplifier arranged to: i) receive the pre-warped signal pulses, ii) receive a continuous wave signal, and iii) output amplified signal pulses that maintain a substantially constant drive intensity at the input of a non-linear wavelength converter; and
    the non-linear wavelength converter arranged to receive the amplified signal pulses and emit wavelength-converted pulses;
a receiver arranged to receive scattered laser pulses corresponding to the emitted wavelength-converted pulses; and
a processor arranged to process the received scattered laser pulses and generate LADAR image data.

* * * * *